United States Patent
Maruyama et al.

(10) Patent No.: US 8,253,326 B2
(45) Date of Patent: *Aug. 28, 2012

(54) LIGHT-EMITTING DEVICE AND MANUFACTURING METHOD THEREOF

(75) Inventors: Tsukasa Maruyama, Tokyo (JP);
Tetsuya Ikuta, Tokyo (JP)

(73) Assignee: Dowa Electronics Materials Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 12/805,231

(22) Filed: Jul. 20, 2010

(65) Prior Publication Data

US 2010/0289405 A1 Nov. 18, 2010

Related U.S. Application Data

(63) Continuation of application No. 11/987,177, filed on Nov. 28, 2007.

(30) Foreign Application Priority Data

Nov. 28, 2006 (JP) .................................. 2006-320149

(51) Int. Cl.
*H01J 1/62* (2006.01)
(52) U.S. Cl. ........ 313/506; 313/501; 313/502; 313/512; 445/24
(58) Field of Classification Search .......... 313/498–512; 445/24, 25
See application file for complete search history.

(56) References Cited

U.S. PATENT DOCUMENTS

| | | | | |
|---|---|---|---|---|
| 2002/0171911 | A1* | 11/2002 | Maegawa | 359/308 |
| 2003/0038587 | A1* | 2/2003 | Onishi | 313/496 |
| 2004/0104391 | A1* | 6/2004 | Maeda et al. | 257/79 |
| 2004/0144987 | A1* | 7/2004 | Ouderkirk et al. | 257/98 |
| 2004/0207998 | A1* | 10/2004 | Suehiro et al. | 362/84 |
| 2004/0212291 | A1 | 10/2004 | Keuper | |
| 2005/0052878 | A1* | 3/2005 | Yamada et al. | 362/460 |
| 2005/0157483 | A1* | 7/2005 | Chan et al. | 362/84 |
| 2005/0269931 | A1* | 12/2005 | Kim et al. | 313/485 |
| 2006/0239006 | A1* | 10/2006 | Chaves et al. | 362/294 |

FOREIGN PATENT DOCUMENTS

| | | |
|---|---|---|
| JP | 2001-127346 A | 5/2001 |
| JP | 2003-115614 A | 4/2003 |

* cited by examiner

*Primary Examiner* — Bumsuk Won
(74) *Attorney, Agent, or Firm* — Rader, Fishman & Grauer PLLC

(57) ABSTRACT

A light-emitting device of the present invention includes: a light-emitting element; and a phosphor layer containing phosphors that absorb light from the light-emitting element and wavelength-convert the absorbed light to emit light. The phosphor layer has a structure in which the phosphors are disposed on an applied adhesive with a thickness equal to or less than an average particle size of the phosphors. A thickness of the phosphor layer is equal to or less than five times the average particle size of the phosphors, and an occupancy ratio of the phosphors in the phosphor layer is 50% or more. Further, the phosphors disposed on the adhesive has an adjusted particle size.

12 Claims, 25 Drawing Sheets

FIG.18

| ANGLE | LUMINANCE RATIO | COLOR TEMPERATURE | Ra |
|---|---|---|---|
| 0 | – | – | – |
| 10 | 0.187 | 4,434 | 96 |
| 20 | 0.350 | 4,531 | 93 |
| 30 | 0.514 | 4,572 | 93 |
| 40 | 0.654 | 4,585 | 92 |
| 50 | 0.769 | 4,600 | 92 |
| 60 | 0.867 | 4,586 | 91 |
| 70 | 0.936 | 4,599 | 92 |
| 80 | 0.979 | 4,559 | 92 |
| 82 | 0.981 | 4,576 | 91 |
| 84 | 0.995 | 4,533 | 92 |
| 86 | 0.994 | 4,588 | 92 |
| 88 | 0.999 | 4,581 | 92 |
| 90 | 1.000 | 4,579 | 92 |
| 92 | 0.996 | 4,578 | 92 |
| 94 | 0.998 | 4,553 | 92 |
| 96 | 0.997 | 4,578 | 92 |
| 98 | 0.990 | 4,545 | 92 |
| 100 | 0.987 | 4,563 | 92 |
| 110 | 0.955 | 4,541 | 92 |
| 120 | 0.897 | 4,495 | 92 |
| 130 | 0.806 | 4,496 | 92 |
| 140 | 0.706 | 4,488 | 93 |
| 150 | 0.575 | 4,447 | 93 |
| 160 | 0.432 | 4,444 | 94 |
| 170 | 0.260 | 4,367 | 95 |
| 180 | – | – | – |

| | | |
|---|---|---|
| $\Delta$CCT= | 155 | K |
| HALF POWER ANGLE= | 126 | ° |

FIG.20

| ANGLE | LUMINANCE RATIO | COLOR TEMPERATURE | Ra |
|---|---|---|---|
| 0 | – | – | – |
| 10 | 0.108 | 5,003 | 94 |
| 20 | 0.285 | 5,008 | 94 |
| 30 | 0.460 | 5,008 | 94 |
| 40 | 0.615 | 5,010 | 94 |
| 50 | 0.750 | 5,007 | 94 |
| 60 | 0.859 | 5,001 | 94 |
| 70 | 0.939 | 4,995 | 94 |
| 80 | 0.982 | 4,992 | 94 |
| 82 | 0.988 | 4,992 | 94 |
| 84 | 0.993 | 4,997 | 94 |
| 86 | 0.996 | 4,993 | 94 |
| 88 | 0.999 | 4,990 | 94 |
| 90 | 1.000 | 4,993 | 94 |
| 92 | 0.998 | 4,990 | 94 |
| 94 | 0.996 | 4,992 | 94 |
| 96 | 0.993 | 4,992 | 94 |
| 98 | 0.987 | 4,995 | 94 |
| 100 | 0.981 | 4,995 | 94 |
| 110 | 0.932 | 5,005 | 94 |
| 120 | 0.852 | 5,003 | 94 |
| 130 | 0.744 | 5,005 | 94 |
| 140 | 0.614 | 5,020 | 94 |
| 150 | 0.463 | 5,024 | 94 |
| 160 | 0.301 | 5,038 | 94 |
| 170 | 0.129 | 5,017 | 94 |
| 180 | – | – | – |
| $\Delta$CCT= | 33 K | | |
| HALF POWER ANGLE= | 115 ° | | |

FIG.22

| ANGLE | LUMINANCE RATIO | COLOR TEMPERATURE | Ra |
|---|---|---|---|
| 0 | – | – | – |
| 10 | 0.101 | 4,879 | 90 |
| 20 | 0.297 | 4,894 | 91 |
| 30 | 0.478 | 4,919 | 91 |
| 40 | 0.640 | 4,958 | 91 |
| 50 | 0.773 | 4,993 | 91 |
| 60 | 0.882 | 5,041 | 92 |
| 70 | 0.953 | 5,106 | 92 |
| 80 | 0.993 | 5,153 | 92 |
| 82 | 0.997 | 5,160 | 92 |
| 84 | 0.999 | 5,166 | 92 |
| 86 | 1.000 | 5,168 | 92 |
| 88 | 1.000 | 5,173 | 92 |
| 90 | 0.998 | 5,173 | 92 |
| 92 | 0.995 | 5,170 | 92 |
| 94 | 0.991 | 5,165 | 92 |
| 96 | 0.984 | 5,158 | 92 |
| 98 | 0.975 | 5,150 | 92 |
| 100 | 0.968 | 5,136 | 92 |
| 110 | 0.913 | 5,092 | 92 |
| 120 | 0.871 | 5,072 | 92 |
| 130 | 0.765 | 5,031 | 91 |
| 140 | 0.636 | 4,991 | 91 |
| 150 | 0.482 | 4,958 | 91 |
| 160 | 0.311 | 4,931 | 91 |
| 170 | 0.139 | 4,913 | 91 |
| 180 | – | – | – |
| ΔCCT= | 249 K | | |
| HALF POWER ANGLE= | 118 ° | | |

FIG.24

| ANGLE | LUMINANCE RATIO | COLOR TEMPERATURE | Ra |
|---|---|---|---|
| 0 | - | - | - |
| 10 | 0.106 | 4,880 | 91 |
| 20 | 0.279 | 4,828 | 91 |
| 30 | 0.456 | 4,802 | 91 |
| 40 | 0.615 | 4,788 | 92 |
| 50 | 0.747 | 4,771 | 92 |
| 60 | 0.850 | 4,764 | 92 |
| 70 | 0.923 | 4,740 | 92 |
| 80 | 0.973 | 4,730 | 92 |
| 82 | 0.979 | 4,736 | 92 |
| 84 | 0.986 | 4,725 | 92 |
| 86 | 0.982 | 4,731 | 92 |
| 88 | 0.967 | 4,730 | 92 |
| 90 | 1.000 | 4,723 | 92 |
| 92 | 0.976 | 4,741 | 92 |
| 94 | 0.984 | 4,741 | 92 |
| 96 | 0.969 | 4,734 | 92 |
| 98 | 0.976 | 4,736 | 92 |
| 100 | 0.970 | 4,739 | 92 |
| 110 | 0.919 | 4,734 | 92 |
| 120 | 0.856 | 4,762 | 91 |
| 130 | 0.733 | 4,780 | 91 |
| 140 | 0.614 | 4,802 | 91 |
| 150 | 0.461 | 4,811 | 91 |
| 160 | 0.289 | 4,840 | 91 |
| 170 | 0.122 | 4,830 | 91 |
| 180 | - | - | - |
| $\Delta$CCT= | 86 K | | |
| HALF POWER ANGLE= | 115 ° | | |

FIG.26

| ANGLE | LUMINANCE RATIO | COLOR TEMPERATURE | Ra |
|---|---|---|---|
| 0 | – | – | – |
| 10 | 0.185 | 3,867 | 89 |
| 20 | 0.348 | 4,149 | 90 |
| 30 | 0.505 | 4,324 | 91 |
| 40 | 0.646 | 4,458 | 92 |
| 50 | 0.769 | 4,583 | 92 |
| 60 | 0.867 | 4,700 | 93 |
| 70 | 0.937 | 4,787 | 93 |
| 80 | 0.982 | 4,864 | 93 |
| 82 | 0.989 | 4,872 | 93 |
| 84 | 0.993 | 4,876 | 93 |
| 86 | 0.995 | 4,885 | 94 |
| 88 | 0.998 | 4,889 | 94 |
| 90 | 1.000 | 4,890 | 94 |
| 92 | 1.000 | 4,893 | 94 |
| 94 | 0.998 | 4,898 | 94 |
| 96 | 0.995 | 4,898 | 94 |
| 98 | 0.992 | 4,890 | 94 |
| 100 | 0.989 | 4,886 | 94 |
| 110 | 0.952 | 4,852 | 93 |
| 120 | 0.887 | 4,772 | 93 |
| 130 | 0.796 | 4,669 | 93 |
| 140 | 0.679 | 4,549 | 92 |
| 150 | 0.535 | 4,413 | 92 |
| 160 | 0.371 | 4,246 | 91 |
| 170 | 0.204 | 3,973 | 90 |
| 180 | – | – | – |
| $\Delta$CCT= | 580 K | | |
| HALF POWER ANGLE= | 122 ° | | |

FIG.29

| ANGLE | LUMINANCE RATIO | COLOR TEMPERATURE | Ra |
|---|---|---|---|
| 0 | – | – | – |
| 10 | – | – | – |
| 20 | 0.462 | 5,213 | 93 |
| 30 | 0.602 | 5,054 | 93 |
| 40 | 0.717 | 4,949 | 92 |
| 50 | 0.816 | 4,867 | 92 |
| 60 | 0.895 | 4,820 | 92 |
| 70 | 0.956 | 4,799 | 92 |
| 80 | 0.989 | 4,765 | 91 |
| 82 | 0.994 | 4,755 | 91 |
| 84 | 0.995 | 4,750 | 91 |
| 86 | 1.000 | 4,747 | 91 |
| 88 | 1.000 | 4,743 | 91 |
| 90 | 1.000 | 4,748 | 91 |
| 92 | 0.999 | 4,755 | 91 |
| 94 | 0.997 | 4,743 | 91 |
| 96 | 0.995 | 4,739 | 91 |
| 98 | 0.991 | 4,739 | 91 |
| 100 | 0.987 | 4,738 | 91 |
| 110 | 0.946 | 4,724 | 91 |
| 120 | 0.883 | 4,737 | 91 |
| 130 | 0.801 | 4,821 | 92 |
| 140 | 0.693 | 4,939 | 92 |
| 150 | 0.574 | 5,113 | 93 |
| 160 | 0.433 | 5,313 | 93 |
| 170 | – | – | – |
| 180 | – | – | – |
| $\Delta$CCT= | 494 K | | |
| HALF POWER ANGLE= | 133 ° | | |

LIGHT-EMITTING DEVICE AND MANUFACTURING METHOD THEREOF

CROSS REFERENCE TO RELATED APPLICATIONS

The present application is a Continuation Application of patent application Ser. No. 11/987,177, filed Nov. 28, 2007, which claims priority to Japanese Patent Applications JP2006-320149, filed on November 28, the entire contents of which are herein incorporated by reference.

BACKGROUND OF THE INVENTION

1. Field of the Invention

The present invention relates to a light-emitting device emitting white light with reduced tone unevenness, which is used as, for example, an illumination light source, a light source of a backlight of a liquid crystal display, and relates to a manufacturing method thereof.

2. Description of the Related Art

In recent years, a light-emitting device has been developed which emits white light having a wide emission wavelength interval by combining a light-emitting element which emits ultraviolet light or blue light and phosphors which absorb the light from the light-emitting element and wavelength-converts the absorbed light to emit long-wavelength light. Since such a light-emitting device is used as, for example, an illumination light source, a light source of a backlight of a liquid crystal display, and the like, it is very important to reduce tone unevenness of light emitted from the light-emitting device to improve its color rendering property.

Japanese Patent Application Laid-open No. 2003-115614 discloses a light-emitting device art of forming a phosphor layer containing phosphors which are uniformly dispersed on a light-emitting element by spraying a coating solution containing the phosphors to the light-emitting element with a spray or a dispenser. This Japanese Patent Application Laid-open No. 2003-115614 realizes reduced tone unevenness since light emitted from the light-emitting element to the phosphor layer is uniformly wavelength-converted.

Japanese Patent Application Laid-open No. 2003-115614 discloses a light-emitting device art reducing tone unevenness by realizing uniform distribution of phosphors owing to a phosphor layer with a constant thickness which is formed by spraying the phosphors from above an adhesive layer absorbing irregularities of a light-emitting element and its appendix after forming the adhesive layer by applying an adhesive (epoxy resin with a thickness used as the adhesive) on the light-emitting element.

Japanese Patent Application Laid-open No. 2001-127346 discloses a light-emitting device art realizing a higher color rendering property by disposing, on a light-emitting element, a layer formed of transparent resin in which two kinds or more of phosphors performing different kinds of wavelength conversion are dispersed, and mixing light from the light-emitting element and lights wavelength-converted by the phosphors.

SUMMARY OF THE INVENTION

However, in the light-emitting device art described in the aforesaid Japanese Patent Application Laid-open No. 2003-115614, a thickness of the phosphor layer formed at a time when the coating solution containing the phosphors is applied on the light-emitting element is, for example, about 20 μm or more, which is larger than an average particle size of typical phosphors. Therefore, the phosphors settle in the coating solution before the coating solution cures, resulting in uneven distribution of the phosphors in the phosphor layer. Further, since the phosphors are dispersed in the coating solution for use, surface tension unique to liquid occurs in the coating solution applied on the light-emitting element, and due to an influence of the surface tension, thickness variation occurs in the phosphor layer, and this also causes uneven distribution of the phosphors. Due to such uneven distribution of the phosphors, an amount of wavelength conversion of light from the light-emitting element varies depending on light emission directions, resulting in uneven tone and a decreased color rendering property of light emitted by the light-emitting device.

In the light-emitting device art described in the aforesaid Japanese Patent Application Laid-open No. 2003-115614, before the adhesive cures, the phosphors are sprayed to the adhesive layer provided on the light-emitting element by using gas, and therefore, the adhesive deforms due to the pressure of the gas, resulting in thickness variation of the adhesive layer. Especially because the adhesive layer has a predetermined thickness or more so as to absorb the irregularities of the light-emitting element and its appendix, thickness variation of the adhesive layer easily occurs. Accordingly, shape variation of the phosphor layer formed on the adhesive layer also occurs and thus the distribution of the contained phosphors becomes uneven, resulting in uneven tone and a decreased color rendering property of the light emitted by the light-emitting device.

In the light-emitting device art described in the aforesaid Japanese Patent Application Laid-open No. 2001-127346, since the phosphors are dispersed in the resin layer for use, the phosphors settle in the resin layer to be unevenly distributed in the resin layer, resulting in uneven tone and a decreased color rendering property of the light emitted by the light-emitting device, as is the case in Japanese Patent Application Laid-open No. 2003-115614.

The present invention was made in view of the above-described problems, and its object is to provide a light-emitting device realizing reduced tone unevenness and an improved color rendering property, and to provide a manufacturing method thereof.

To solve the above problems, according to the present invention, there is provided a light-emitting device including: a light-emitting element; and a phosphor layer containing phosphors that absorb light from the light-emitting element and wavelength-convert the absorbed light to emit light, wherein a difference between a maximum thickness and a minimum thickness of the phosphor layer is equal to or less than two times an average particle size of the phosphors, and an occupancy ratio of the phosphors in the phosphor layer is 50% or more.

In the above light-emitting device, the phosphor layer is composed of a plurality of phosphor layers containing different phosphors, and the difference between the maximum thickness and the minimum thickness of the phosphor layer closest to the light-emitting element, among the plural phosphor layers, may be equal to or less than two times the average particle size of the phosphors contained in the phosphor layer closest to the light-emitting element.

In the above light-emitting device, a thickness of the phosphor layer may be equal to or less than five times the average particle size of the phosphors.

In the above light-emitting device, the phosphor layer may be composed of one or more stacked phosphor forming layers in which the phosphors are disposed on an adhesive whose thickness is equal to or less than the average particle size of the phosphors.

In the above light-emitting device, the occupancy ratio in the phosphor forming layer farthest from the light-emitting element, among the one or more phosphor forming layers, may be 50% or less.

In the above light-emitting device, the phosphors may have an adjusted particle size.

In the above light-emitting device, the phosphor layer may be stacked in one layer or more on a light-emitting surface of the light-emitting element.

According to another aspect of the present invention, there is provided a light-emitting device emitting light, a difference between maximum color temperature and minimum color temperature of the light in a half power angle being 250 K or less and an average color rendering index of the light being 90 or more.

According to another aspect of the present invention, there is provided a manufacturing method of a light-emitting device including: a light-emitting element; and a phosphor layer containing phosphors that absorb light from the light-emitting element and wavelength-convert the absorbed light to emit light, the method including: forming the phosphor layer directly or via an intermediate layer on a light-emitting surface of the light-emitting element so as to cover the light-emitting surface of the light-emitting element, a difference between a maximum thickness and a minimum thickness of the phosphor layer being equal to or less than two times an average particle size of the phosphors and an occupancy ratio of the phosphors contained in the phosphor layer being 50% or more.

In the above manufacturing method of the light-emitting device, the phosphor layer may be formed to have a thickness that is equal to or less than five times the average particle size of the phosphors.

In the above manufacturing method of the light-emitting device, in forming the phosphor layer, a step of forming a phosphor forming layer may be performed until desired color temperature is obtained from the phosphor layer, the step of forming the phosphor forming layer being a step in which an adhesive with a thickness equal to or less than the average particle size of the phosphors is applied on a surface for stacking, and the phosphors are disposed on the applied adhesive to form the phosphor forming layer.

In the above manufacturing method of the light-emitting device, in forming the phosphor layer, the color temperature of the phosphors in the phosphor layer may be adjusted by setting an occupancy ratio of the phosphors in the phosphor forming layer formed last to 50% or less.

In the above manufacturing method of the light-emitting device, in applying the adhesive, viscosity of the adhesive may be lowered.

In the above manufacturing method of the light-emitting device, in disposing the phosphors, a particle size of the phosphors to be disposed may be adjusted.

According to the present invention, since the sedimentation of the phosphors in the phosphor forming layer can be prevented, the phosphors can be uniformly distributed in the phosphor layer. This makes it possible to provide a light-emitting device emitting light with reduced tone unevenness and an improved color rendering property, and to provide a manufacturing method thereof.

BRIEF DESCRIPTION OF THE DRAWINGS

FIG. 10 is an explanatory view showing the procedure for stacking a phosphor forming layer 10b on a phosphor forming layer 10a;

FIG. 11 is an explanatory view showing the procedure for stacking the phosphor forming layer 10b on the phosphor forming layer 10a;

FIG. 12 is an explanatory view showing the procedure for stacking the phosphor forming layer 10b on the phosphor forming layer 10a;

FIG. 18 is a table showing measurement results of a luminance ratio and correlated color temperature of the light-emitting device 1 shown in FIG. 2;

FIG. 20 is a table showing measurement results of a luminance ratio and correlated color temperature of the light-emitting device 1 shown in FIG. 14;

FIG. 22 is a table showing measurement results of a luminance ratio and correlated color temperature of the light-emitting device 1 shown in FIG. 15;

FIG. 24 is a table showing measurement results of a luminance ratio and correlated color temperature of the light-emitting device 1 shown in FIG. 16;

FIG. 26 is a table showing measurement results of a luminance ratio and correlated color temperature of a conventionally known light-emitting device 100 as a comparative example 1 shown in FIG. 27;

FIG. 29 is a table showing measurement results of a luminance ratio and correlated color temperature of a conventionally known light-emitting device 100 as a comparative example 2 shown in FIG. 30;

DETAILED DESCRIPTION OF THE INVENTION

Figure 1:
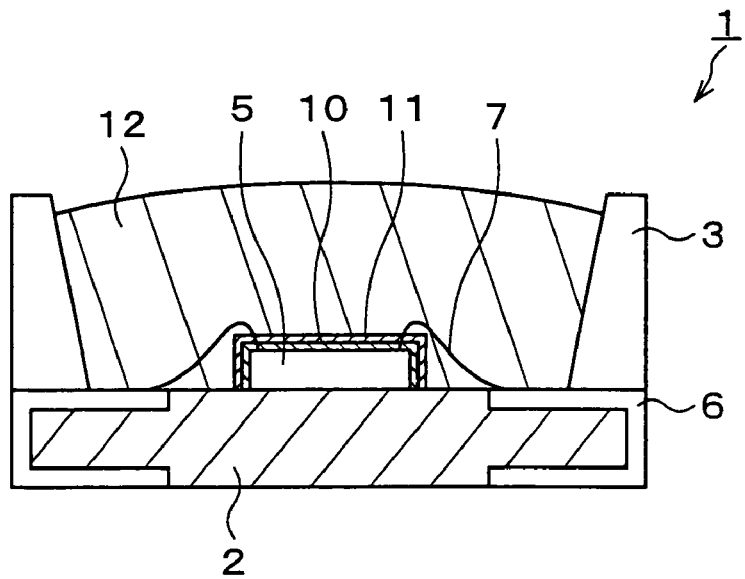
FIG. 1 is a view showing the whole structure of a light-emitting device 1 according to a first embodiment of the present invention.

Hereinafter, a preferred embodiment of the present invention will be described with reference to the drawings. In the specification and the drawings, the same reference numerals and symbols are used to designate substantially the same constituent elements, and redundant description thereof will be omitted.

Figure 2:
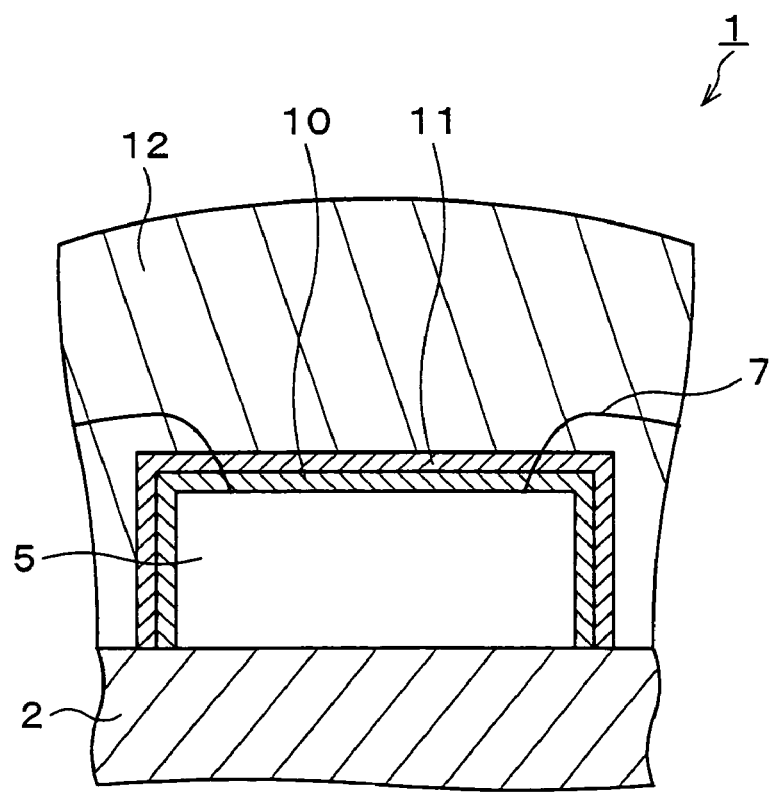
FIG. 2 is an enlarged view showing, in an enlarged manner, a light-emitting element 5 included in the light-emitting device 1 shown in FIG. 1.
Figure 3:
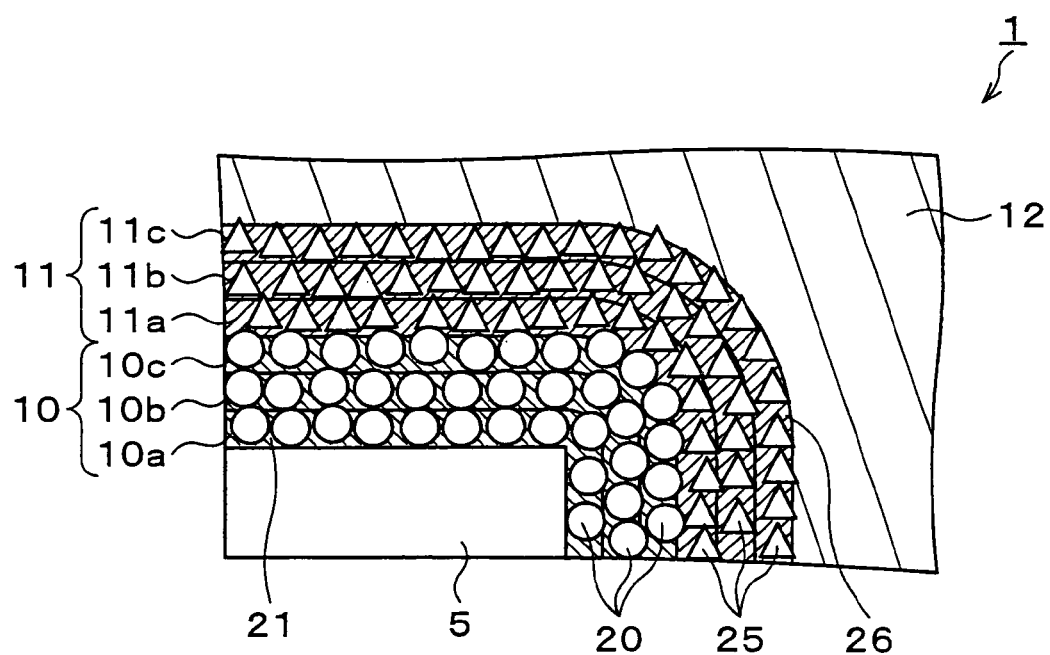
FIG. 3 is an enlarged view showing, in an enlarged manner, a phosphor layer 10 and a phosphor layer 11 formed on the light-emitting element 5 shown in FIG. 2.

FIG. 1 is a view showing the whole structure of a light-emitting element 1 according to a first embodiment of the present invention. FIG. 2 is an enlarged view showing, in an enlarged manner, a light-emitting element 5 included in the light-emitting device 1 shown in FIG. 1. FIG. 3 is an enlarged view showing, in an enlarged manner, a phosphor layer 10 and a phosphor layer 11 formed on the light-emitting element 5 shown in FIG. 2.

As shown in FIG. 1, the light-emitting device 1 according to the embodiment of the present invention has a structure in which, for example, a LED emitting blue light is mounted as the light-emitting element 5 on a substrate 2 in a flat plate shape. A sidewall 3 formed in a ring shape so as to surround the periphery of the light-emitting element 5 is provided on the substrate 2. External electrodes 6 supplied with power from an external power source (not shown) are provided on the substrate 2. The external electrodes 6 are connected to the light-emitting element 5 via lead wires 7.

As shown in FIG. 1 and FIG. 2, two kinds of phosphor layers 10, 11 each having a thickness of, for example, not less than a 20 μm nor more than 50 μm are provided in sequence on the light-emitting element 5 so as to cover an upper surface and side surfaces, which are light-emitting surfaces, of the light-emitting element 5. The term "light-emitting surfaces" means light exit surfaces, of the light-emitting element 5, which serve as light sources radiating light to an area around the light-emitting device 1, and in the case of the light-emitting element 5 shown in FIG. 1, since the light-emitting element 5 is disposed on the substrate 2, the upper surface and the side surfaces except a bottom surface are the light-emitting surfaces. The expression "cover the light-emitting surfaces" of the light-emitting element 5 by using the phosphor layer 10 and so on is used in the following two meanings: "the phosphor layer 10 etc. are disposed directly on the light-emitting surfaces of the light-emitting element 5 to cover the light-emitting surfaces" and "the phosphor layer 10 etc. are disposed above the light-emitting surfaces of the light-emitting element 5 via an intermediate layer, a space, or the like without being in direct contact with the light-emitting surfaces to cover the light-emitting surfaces.

A sealing member 12 such as, for example, transparent resin is filled from above the phosphor layers 10, 11 into a recessed portion formed by the sidewall 3 formed in the ring shape and the substrate 2 to confine the light-emitting element 5. As shown in FIG. 3, the phosphor layer 10 is composed of three phosphor forming layers 10a to 10c which are stacked in this order from the bottom on the light-emitting element 5. The phosphor layer 11 is composed of three phosphor forming layers 11a to 11c which are stacked in this order from the bottom on the phosphor layer 10 (that is, the phosphor forming layer 10c). Here, a difference between the maximum thickness and the minimum thickness of the phosphor layer 10 is set equal to or less than two times an average particle size of phosphors 20 contained in the phosphor layer 10. Likewise, a difference between the maximum thickness and the minimum thickness of the phosphor layer 11 is set equal to or less than two times an average particle size of phosphors 25 contained in the phosphor layer 11. In this specification, the average particle sizes of the phosphors 20, are measured in the following manner. The phosphor layer of the light-emitting device 1 is cut, its cross section is photographed by a scanning electron microscope (SEM), the longest diameter value of each particle of the phosphors 20, 25 is measured based on an obtained SEM photograph, and an average diameter value of the particles whose longest diameter values are 1 μm or more is calculated.

The phosphor forming layer 10a is formed such that the phosphors 20 whose average particle size is, for example, 7 μm are fixed to an adhesive 21 applied to, for example, a 5 μm thickness smaller than the average particle size of the phosphors 20. An occupancy ratio of the phosphors 20 in the phosphor forming layer 10a is set to 60% or more. Here, the term "occupancy ratio" will be explained. The term "occupancy ratio" used in this specification means a ratio of an area occupied by phosphors included in a cross section of a cut phosphor layer or phosphor forming layer of the light-emitting device 1 relative to the total area of the cross section. In measuring an occupancy ratio of phosphors in a phosphor layer or a phosphor forming layer, the occupancy ratio is calculated based on a photograph of the cut light-emitting device 1, as in measuring the average particle size of phosphors described above. The higher a ratio of a volume of the phosphors to the total volume of the phosphor layer (that is, a filling factor) is, the higher the calculated occupancy ratio of the phosphor layer is.

The phosphor forming layers 10b, 10c have the same structure as that of the phosphor forming layer 10a. Since the filling factors of the phosphors 20 contained in the phosphor forming layers 10a to 10c are high, that is, since the occupancy ratios of the phosphors in the cross sections of the phosphor forming layers 10a to 10c are all set to 60% or more, the occupancy ratio of the phosphors 20 in the phosphor layer 10 is 60% or more. Similarly to the phosphor forming layer 10a, the phosphor forming layer 11a is formed such that the phosphors 25, of a different type from the phosphors 20, whose average particle size is, for example, 10 μm are fixed to an adhesive 26 applied to, for example, a 5 μm thickness smaller than the average particle size of the phosphors 25. The phosphor forming layers 11b, 11c are formed in the same manner as the phosphor forming layer 11a. Since the occupancy ratios of the phosphors 25 in the phosphor forming layers 11a to 11c are all set to 60% or more, the occupancy ratio of the phosphors 25 in the phosphor layer 11 is 60% or more.

In this embodiment, as the phosphors 20, used are phosphors which absorb blue light emitted by the light-emitting element 5 and wavelength-convert the absorbed light to emit red light. As the phosphors 25, used are phosphors which absorb blue light emitted by the light-emitting element 5 and wavelength-convert the absorbed light to emit green light. When two kinds or more of the phosphors 20, 25 are thus disposed, the phosphors 20, are disposed so as to prevent light that the phosphors 20 contained in the phosphor layer 10 on a side closer to the light-emitting element 5 (that is, on an inner side) emit after wavelength-converting the absorbed light from being further wavelength-converted by the phosphors 25 of another kind contained in the phosphor layer 11 on a side farther from the light-emitting element 5 (that is, on an outer side). Consequently, tone adjustment can be easily made and the light-emitting element can have high emission efficiency.

Concretely, in this embodiment, for example, a wavelength of red light emitted by the phosphors 20 disposed in the phosphor layer 10 closer to the light-emitting element 5 does not fall in a wavelength range (energy range) that the phosphors 25 disposed in the phosphor layer 11 farther from the light-emitting element 5 absorb in order to emit green light, and therefore, the red light from the phosphors 20 on a lower layer has no risk of being absorbed and wavelength-converted by the phosphors 25 on an upper layer. In this manner, by disposing the phosphors 20 emitting light with a longer wavelength on a side closer to the light-emitting element 5 (that is, on an inner side) and disposing the phosphors 25 absorbing light with a shorter wavelength on a side farther from the light-emitting element 5 (that is, on an outer side), it is possible to prevent a decrease in emission power ascribable to repeated wavelength conversion by two kinds or more of the phosphors 20, 25.

Figure 4:
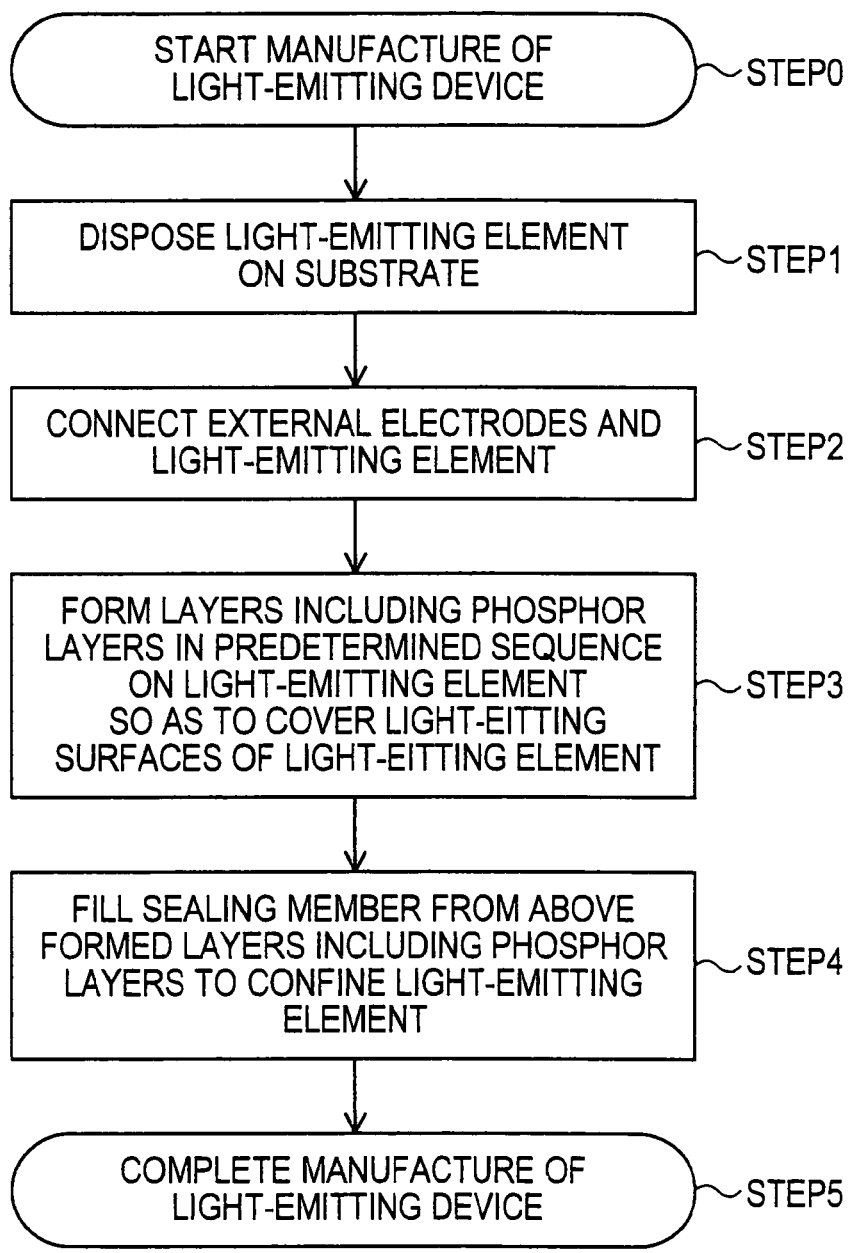
FIG. 4 is a flowchart showing the whole procedure of a manufacturing method according to an embodiment of the present invention.

Next, a manufacturing method according to an embodiment of the present invention for manufacturing the light-emitting device 1 as structured above will be described by using FIG. 4. FIG. 4 is a flowchart showing the whole procedure of the manufacturing method according to the embodiment of the present invention.

As shown in FIG. 4, at the start of the manufacture of the light-emitting device 1 (Step 0), the light-emitting element 5 is first disposed on the substrate 2 by using, for example, solder or conductive paste (Step 1). Next, the lead wires 7 are connected to the light-emitting element 5 and the external electrodes 6 by using, for example, an ultrasonic bonding method or a pressure bonding method (Step 2). Thereafter, layers including the phosphor layers 10, 11 are formed in a predetermined sequence on the light-emitting element 5 so as to cover the light-emitting surfaces of the light-emitting element 5 (Step 3). In this embodiment, as shown in FIG. 1 and FIG. 2, the two different phosphor layers 10, 11 are sequentially formed in stack on the light-emitting element 5. After the formation of the phosphor layers 10, 11 is finished, the sealing member 12 such as, for example, transparent resin is filled from above the phosphor layer 11 into the recessed portion formed by the sidewall 3 formed in the ring shape and the substrate 2 to confine the light-emitting element 5 together with the phosphor layers 10, 11 (Step 4). Through Step 0 to Step 4 described above, the manufacture of the light-emitting device 1 is completed (Step 5).

Figure 5:
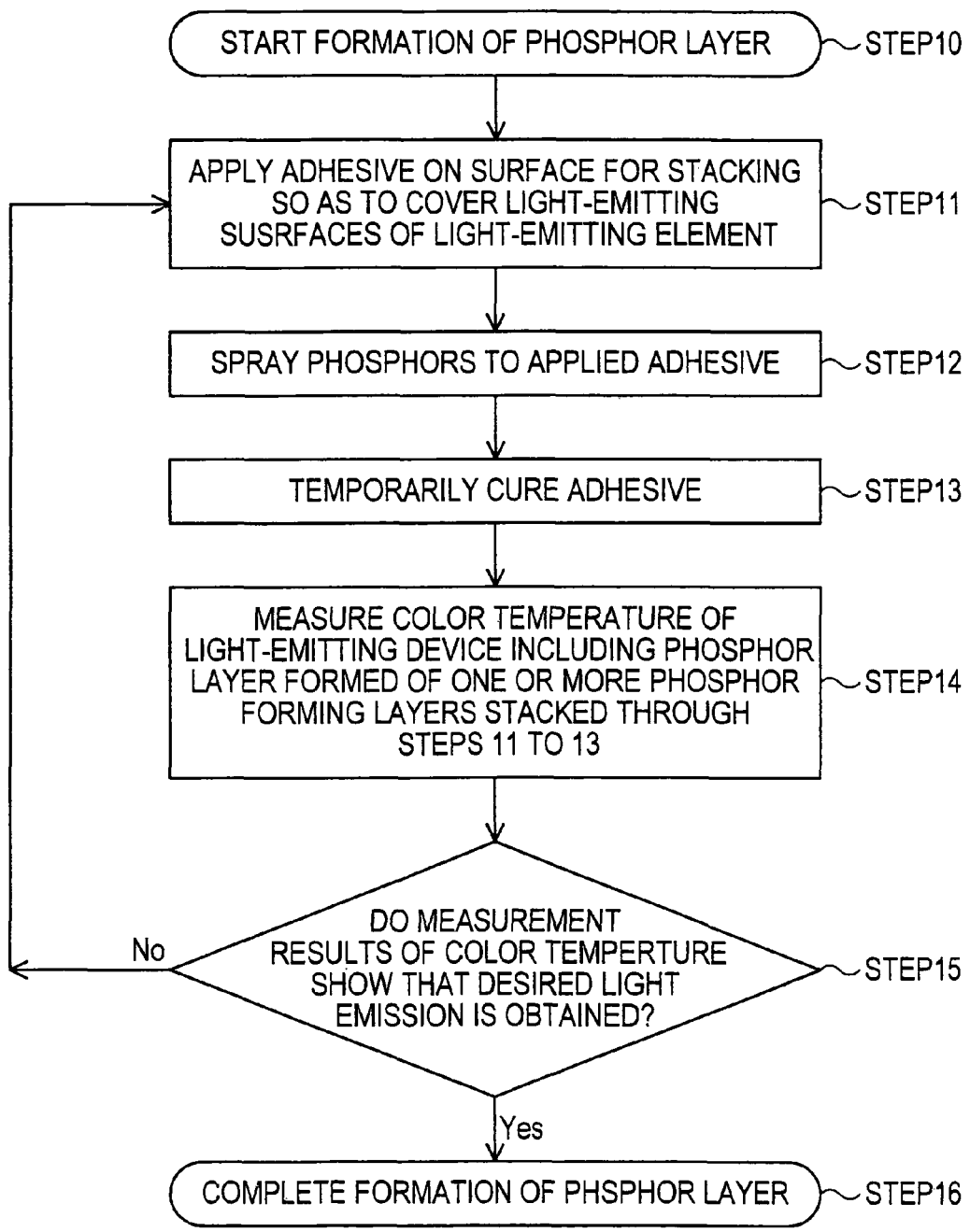
FIG. 5 is a flowchart showing the procedure at Step 3 in FIG. 4.

The following will describe in detail the procedure for forming the phosphor layers 10, 11 in forming the various layers at Step 3. In this embodiment, the phosphor layers 10, 11 are formed in sequence on the light-emitting surfaces of the light-emitting element 5. FIG. 5 is a flowchart showing the procedure for forming the phosphor layers 10, 11 at Step 3. In the following description, the phosphor layer 10 formed directly on the light-emitting element 5 will be taken as an example.

Figure 6:
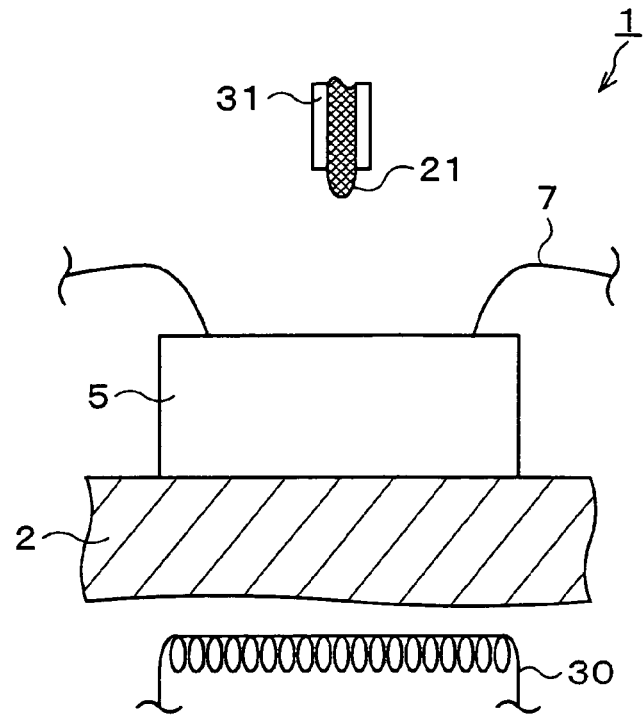
FIG. 6 is an explanatory view showing the procedure for applying an adhesive 21 on the light-emitting element 5 at Step 11 in FIG. 5.
Figure 7:
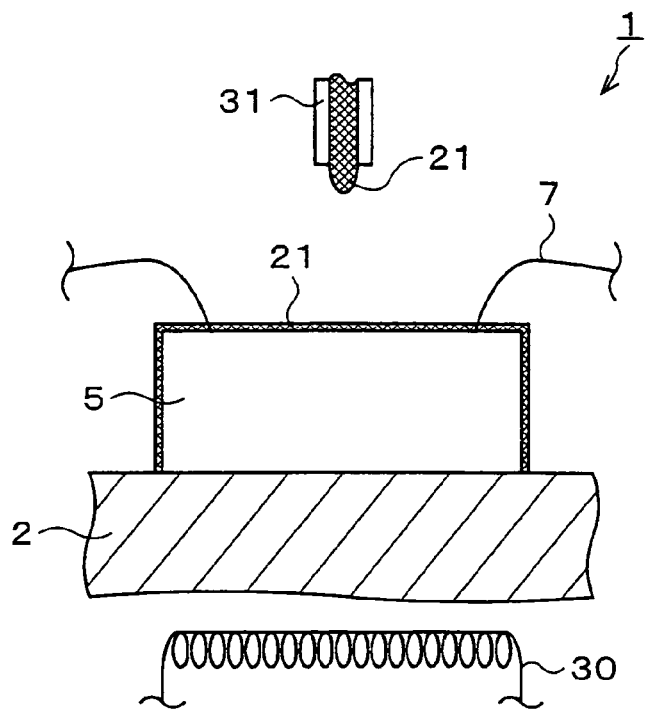
FIG. 7 is an explanatory view showing a state after the adhesive 21 is applied on the light-emitting element 5 in the procedure at Step 11 in FIG. 5.

As shown in FIG. 5, when the formation of the phosphor layer 10 is started (Step 10), the adhesive 21 such as, for example, silicon or epoxy is applied on the light-emitting element 5, which is a surface for stacking, by, for example, a dispense method or a spray method (Step 11). FIG. 6 and FIG. 7 are explanatory views showing the procedure for applying the adhesive 21 on the light-emitting element 5 by the dispense method at Step 10.

At the time of the application of the adhesive 21, the upper surface and the side surfaces as the light-emitting surfaces of the light-emitting element 5 on which the adhesive 21 is to be applied are heated by a heater 30 disposed under the light-emitting element 5 and the substrate 2, as shown in FIG. 6. The adhesive 21 discharged from a needle-shaped discharge port 31 is heated on thus heated light-emitting surfaces to decrease in viscosity, and is distributed on the light-emitting surfaces of the light-emitting element 5 to have a uniform thickness owing to a reduced influence of surface tension, as shown in FIG. 7. Consequently, thickness variation of the adhesive 21 is prevented because the adhesive 21 does not rise on the light-emitting surfaces of the light-emitting element 5 due to surface tension. As a result, the thickness of the adhesive 21 applied on the surface for stacking becomes equal to or less than the average particle size of the phosphors 20 sprayed to the adhesive 21 at Step 12 which will be described later.

Figure 8:
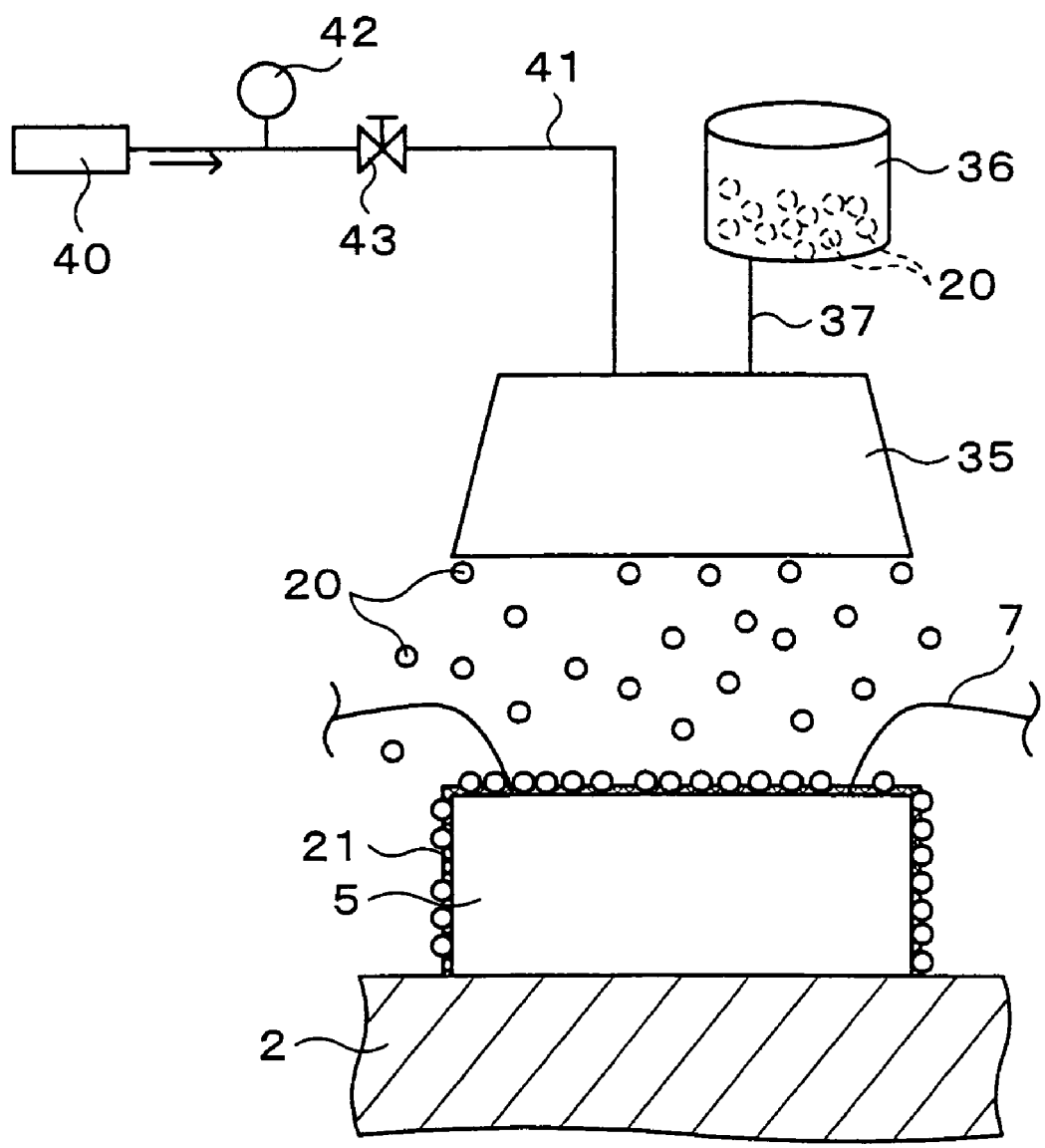
FIG. 8 is an explanatory view showing the procedure for spraying phosphors 20 to the applied adhesive 21 in a case where compressed gas is used, as an example.

While the adhesive 21 applied on the light-emitting surfaces of the light-emitting element 5 at Step 11 is kept viscous, the phosphors 20 are sprayed to the applied adhesive 21 (Step 12) to be disposed on the whole light-emitting surfaces of the light-emitting element 5. FIG. 8 shows the procedure for spraying the phosphors 20 to the applied adhesive 21 in a case where compressed gas is used, as an example.

As shown in FIG. 8, a nozzle 35 spraying the phosphors 20 is disposed at an upper position facing the light-emitting surfaces of the light-emitting element 5. A cartridge 36 supplying the phosphors 20 to be sprayed is connected to the nozzle 35 via a pipe 37. A storage part 40 storing the compressed gas such as, for example, air, nitrogen, or argon is further connected to the nozzle 35 via a pipe 41. A pressure adjusting device 42 and an opening/closing valve 43 which adjust a flow rate and the like of the compressed gas sent from the storage part 40 are attached to the pipe 41. With this structure, the phosphors 20 supplied from the cartridge 36 are ejected from the nozzle 35 with the assist of the compressed gas whose ejection amount has been adjusted by the pressure adjusting device 42 and the opening/closing valve 43, and the phosphors 20 are sprayed to the adhesive 21 applied on the light-emitting surfaces of the light-emitting element 5.

In this embodiment, a sieve (not shown) is provided in the nozzle 35, so that only the phosphors 20 whose particle size is equal to or less than a predetermined value can be ejected from the nozzle 35. In this manner, the particle size of the phosphors 20 sprayed to the applied adhesive 21 from the nozzle 35 is adjusted.

The adhesive 21 on which the phosphors 20 are disposed is heated, for example, at 200° C. for one minute and is temporarily cured (Step 13). Through Steps 11 to 13 described above, the phosphor forming layer 10a is formed on the light-emitting surfaces of the light-emitting element 5.

Figure 9:
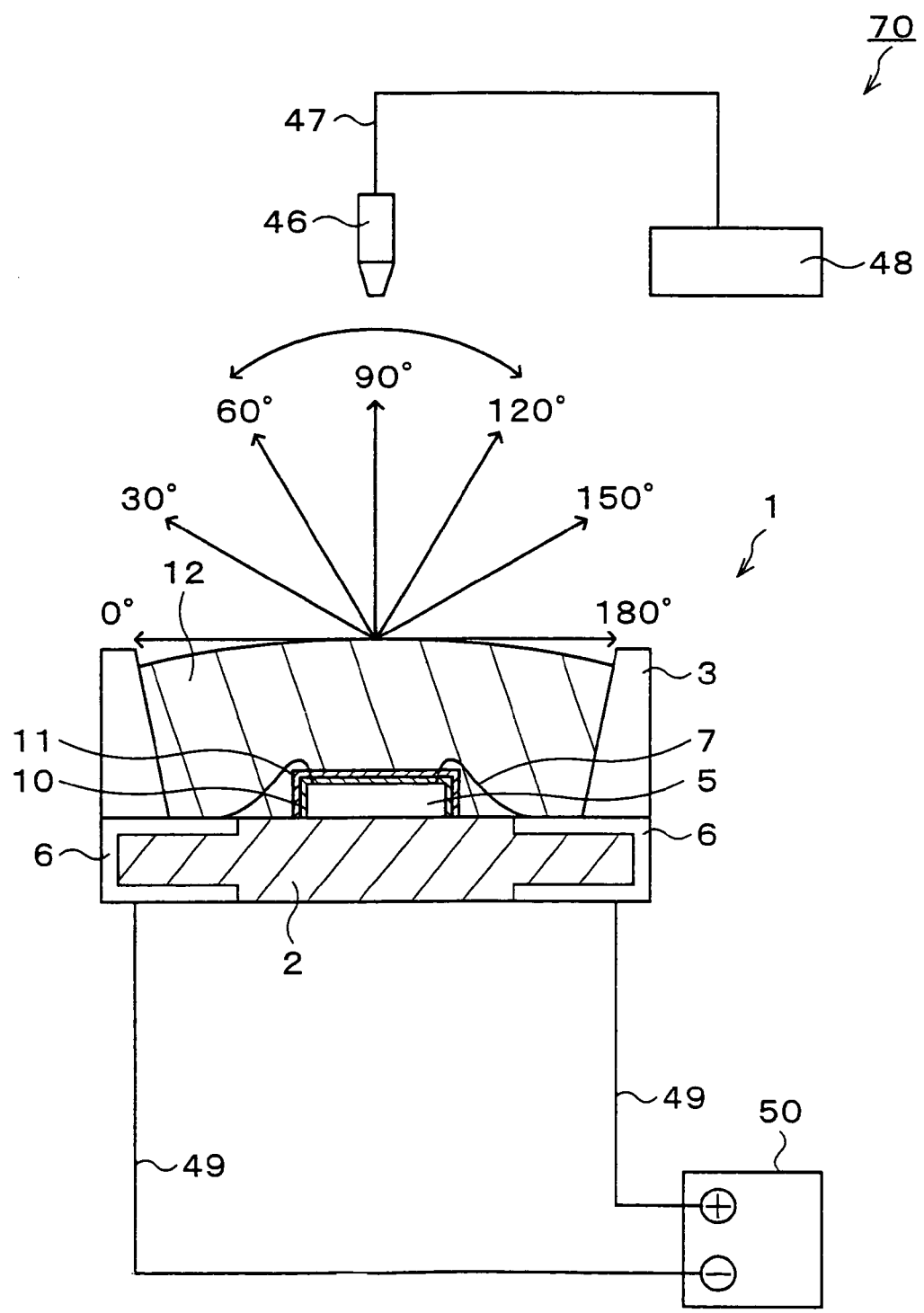
FIG. 9 is a view showing the structure of a tone unevenness measuring device 70 measuring tone unevenness of the light-emitting device.

In order to determine whether or not desired light emission is obtained from the phosphor forming layer 10a formed on the light-emitting surfaces of the light-emitting element 5, color temperature of the light-emitting device 1 is measured (Step 14). FIG. 9 is an explanatory view showing a tone unevenness measuring device 70, as an example of a method of measuring the color temperature of the light-emitting device 1. As shown in FIG. 9, a detector 46 detecting light is disposed at a position facing the light-emitting device 1. In this embodiment, the distance between the light-emitting device 1 and the detector 46 is set to 1.5 m. The detector 46 is connected to a spectroscope 48 via an optical fiber 47. The external electrodes 6 of the light-emitting device 1 as an object to be measured are connected to positive and negative electrodes of a power source 50 via wiring lines 49 and are supplied with power, and the measurement is conducted while the light-emitting device 1 is emitting light.

The measurement of the color temperature is conducted while the light-emitting device 1 as an object to be measured is rotated rightward and leftward in the same vertical plane (paper surface of FIG. 9) from the position shown in FIG. 9. As shown in FIG. 9, the position of the light-emitting device 1 when light radiated therefrom in a direction perpendicular to an upper surface of the substrate can be measured is defined as angle 90°. The position of the light-emitting device 1 rotated rightward by 90 degrees is 0°. The position of the light-emitting device 1 rotated leftward by 90 degrees is 180°. Generally, luminance of a light-emitting device is low when the light-emitting device is at the 0° position, and the luminance increases as the position of the light-emitting device gets closer to 90° from 0°, and decreases again as the position gets closer to 180° from 90°.

Light detected by the detector 46 is sent to the spectroscope 48 via the optical fiber 47. The spectroscope 48 spectrum-analyzes the light detected by the detector 46, and luminance and correlated color temperature of the light-emitting device 1 are measured based on the analysis results.

Figure 10:
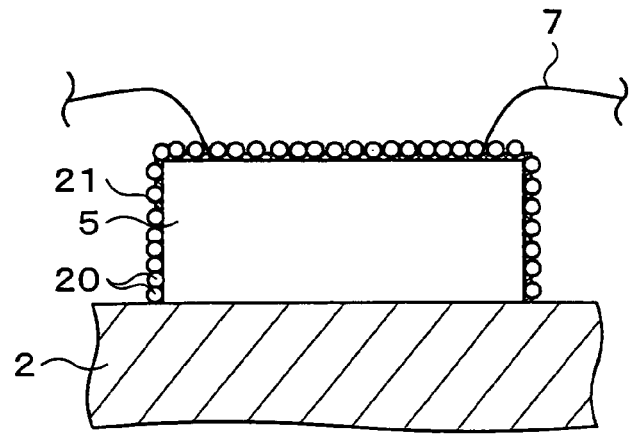
Figure 11:
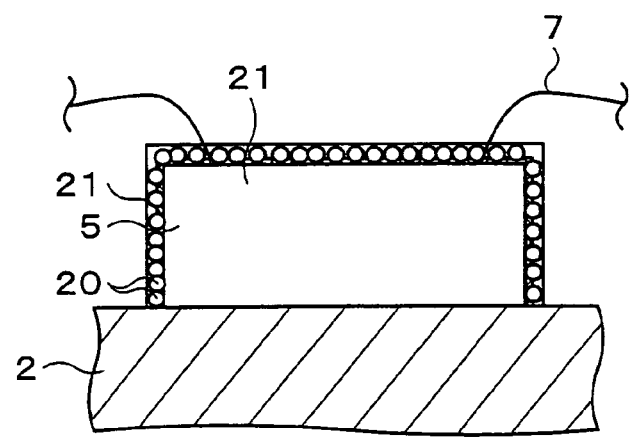
Figure 12:
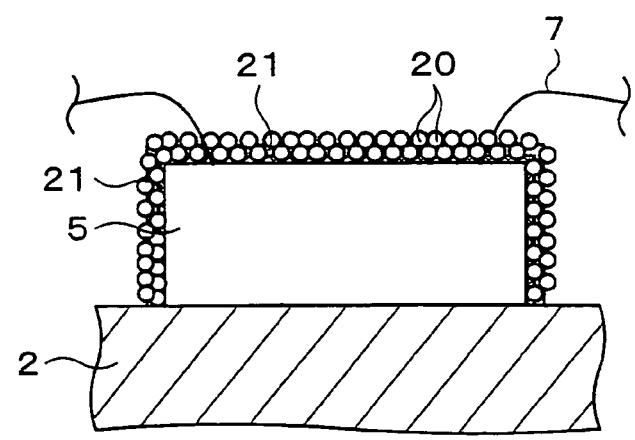

If the measurement results obtained at Step 14 show that the desired light emission is obtained from the light-emitting device 1 on which the phosphor forming layer 10a is formed (Yes at Step 15), the formation of the phosphor layer 10 is completed (Step 16). On the other hand, if the desired light emission is not obtained (No at Step 15), the process returns to Step 11, and Steps 11 to 13 are repeated to stack the new phosphor forming layer 10b. FIG. 10 to FIG. 12 are explanatory views showing the procedure for stacking the new phosphor forming layer 10b. Concretely, the adhesive 21 is applied on the phosphor forming layer 10a as a surface for stacking, which is shown in FIG. 10, formed on the light-emitting surfaces of the light-emitting element 5, as shown in FIG. 11. Then, as shown in FIG. 12, the phosphors 20 are sprayed to and disposed on the adhesive 21 applied on the phosphor forming layer 10a, and thereafter, the adhesive 21 is temporarily cured, whereby the new phosphor forming layer 10b is formed.

In order to determine whether or not the desired light emission is realized in the light-emitting device 1 by the phosphor forming layers 10a, 10b which are stacked as a result of the repetition of Steps 11 to 13, color temperature of the light-emitting device 1 is measured (Step 14). If the measurement results show that the desired light emission is obtained (Yes at Step 15), the formation of the phosphor layer 10 is completed (Step 16). On the other hand, if the desired light emission is not obtained (No at Step 15), the process returns to Step 11, and Steps 11 to 13 are repeated. In the above-described manner, Steps 11 to 15 are repeated as the formation step of forming the phosphor forming layer, thereby stacking the phosphor forming layers 10a, 10b, . . . until the desired light emission is realized in the light-emitting device 1, and the formation of the phosphor layer 10 is completed (Step 16). In this embodiment, the phosphor layer 10 in which the three phosphor forming layers 10a to 10c are stacked is formed as shown in FIG. 3, so that the desired light emission is realized by the phosphor layer 10. By thus stacking the phosphor forming layers 10a to 10c, it is possible to form the phosphor layer 10 with a very small thickness and to set the difference between the maximum thickness and the minimum thickness of the phosphor layer 10 equal to or less than two times the average particle size of the phosphors 20. An average thickness of the phosphor layer 10 formed by stacking the phosphor forming layers (10a, 10b, . . . ) is preferably set equal to or less than five times the average particle size of the phosphors 20 contained therein.

In this embodiment, the occupancy ratios of the phosphors 20 in the phosphor forming layers (10a, 10b, . . . ) are all set to 60% or more, so that the occupancy ratio of the phosphors 20 in the phosphor layer 10 composed of the phosphor forming layers (10a, 10b, . . . ) is set to 60% or more. At the time of the adjustment of the color temperature of the light-emitting device 1, by adjusting the occupancy ratio of the phosphors 20 in the phosphor forming layer that is the farthest from the light-emitting element 5 and formed last to 50% or less, it is possible to finely adjust the color temperature. For example, if the phosphor layer 10 is composed of four phosphor forming layers 10a to 10d (10d is not shown), by setting the occupancy ratios of the phosphors 20 in the three phosphor forming layers 10a to 10c stacked closer to the light-emitting element 5 to 60% or more and setting the occupancy ratio of the phosphors 20 in the phosphor forming layer 10d which is formed last on these three layers (10a to 10c) to 5%, it is possible to change the color temperature in a 100 K unit. At this time, the occupancy ratio of the phosphors 20 in the phosphor layer 10 is about 50%.

The above example describes the phosphor layer 10 which is formed in stack directly on the light-emitting surfaces of the light-emitting element 5, but the same procedure is followed for forming the phosphor layer 11 in stack on the phosphor layer 10 which is a surface for stacking, after the phosphor layer 10 is formed. Further, in this embodiment, the adhesive 26 used when the phosphor layer 11 is formed is the same as the adhesive 21 used when the phosphor layer 10 is formed, but may be different from the adhesive 21.

In a conventional method, if phosphors contained in resin has a high filling factor, that is, if the phosphors are mixed in the resin so as to enable the formation of a phosphor layer in which an occupancy ratio of the phosphors is 50% or more, the resin having the phosphors mixed therein becomes in a sticky sand form and cling to a needle, which makes it difficult to discharge the resin from a dispenser. In this case, a lump of a large amount of phosphors is applied, and thus the phosphor layer cannot be thinned and has a thickness of several hundreds μm. Though the phosphors can be transferred like a stamp, a difference between the maximum thickness and the minimum thickness of the phosphor layer becomes great.

On the other hand, according to the embodiment described above, a phosphor layer with a high filling factor of phosphors, that is, with a 50% occupancy ratio or more of the phosphors can be formed, and the phosphor layer with a very small thickness can be formed. Concretely, it is possible to set the color temperature to an aimed value even when the thickness of the phosphor layer is set equal to less than five times the average particle size. Consequently, a difference between the maximum thickness and the minimum thickness of the phosphor layer (thickness variation) can be reduced to a small value. Further, more uniform distribution of the phosphors 20 in the phosphor layer 10 can be realized. In particular, it is more effective if the difference between the maximum thickness and the minimum thickness in the phosphor layer 10 is reduced to a value equal to or less than two times the average particle size of the phosphors 20. Owing to the reduced thickness variation of the phosphor layer and the uniform distribution of the phosphors, lights radiated in respective emission directions from the light-emitting element 5 to the phosphor layer 10 can be uniformly wavelength-converted. Consequently, it is possible to provide the light-emitting device 1 emitting light with reduced tone unevenness and an improved color rendering property, and to provide the manufacturing method thereof.

Since the phosphor layer 10 has the structure in which the phosphor forming layers 10a to 10c are stacked in one layer or more, it is possible to adjust the distribution of the phosphors 20 in the phosphor layer 10 in a unit of a phosphor forming layer whose thickness is equal to the average particle size of the phosphors 20, which enables more uniform distribution of the phosphors 20 in the phosphor layer 10. In particular, since each of the phosphor forming layers 10a to 10c has the structure in which the phosphors 20 are disposed on the adhesive 21 whose thickness is equal to or less than the average particle size of the phosphors 20, the phosphors 20 does not settle in the thickness direction of each of the phosphor forming layers 10a to 10c, realizing more uniform distribution of the phosphors 20 in the phosphor layer 10 in the thickness direction than has been conventionally realized and thus making it possible to increase a filling factor of the phosphors 20.

Further, since the adhesive 21, when applied on a surface for stacking, is heated to decrease in viscosity and is distributed uniformly on the surface for stacking, the thickness of the phosphor forming layers 10a to 10c can be more uniform and the phosphors 20 can be distributed more uniformly in the phosphor layer 10.

Further, since the adhesive 21 is diluted by a solvent to decrease in viscosity and is uniformly distributed on the surface for stacking, it is possible to make the thickness of the phosphor forming layers 10a to 10c more uniform, enabling more uniform distribution of the phosphors 20 in the phosphor layer 10.

Further, in the process of forming the phosphor layer 10, color temperature of the light-emitting device 1 is measured every time each of the phosphor forming layers 10a to 10c forming the phosphor layer 10 is formed, and accordingly, the color temperature of the phosphor layer 10 of the light-emitting device 1 can be adjusted to a desired value. In particular, by adjusting an amount of the phosphors contained in one phosphor forming layer, it is possible to finely adjust the color temperature, enabling the adjustment of the color temperature in a 100 K unit. This enables the manufacture of the light-emitting device 1 whose phosphor layer 10 can realize light emission which is closer to desired light emission than in a conventional light-emitting device.

Further, since the particle size of the phosphors 20 contained in the phosphor layer 10 is adjusted to, for example, a predetermined value or less, it can be prevented that a portion to which large particles adhere is left as thickness unevenness, and each of the phosphor forming layers 10a to 10c forming the phosphor layer 10 can have more uniform thickness. Because the phosphor layer has the structure in which the phosphor forming layers are stacked, thickness variation of the phosphor layer causing a difference in color temperature of the light-emitting device 1 can be reduced to a value equal to or less than two times the average particle size of the contained phosphors, resulting in further reduced tone unevenness and improved color rendering property.

Figure 13:
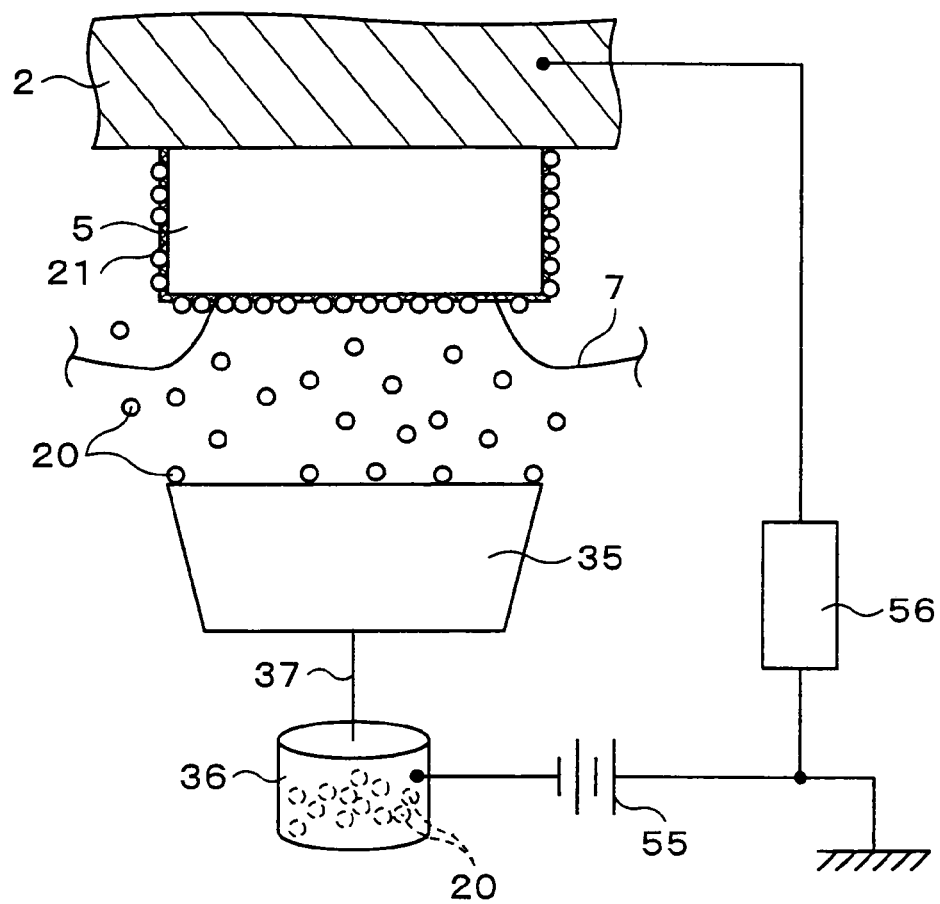
FIG. 13 is an explanatory view showing the procedure for disposing the phosphors 20 on the applied adhesive 21 in a case where electrostatic attraction is used, as an example.

As another example of the first embodiment of the present invention, electrostatic attraction may be used when the phosphors 20 are disposed on the light-emitting surfaces of the light-emitting element 5 on which the adhesive 21 is applied, as shown in FIG. 13. In FIG. 13, both electrodes of a power source 55 capable of applying high voltage are connected to the substrate 2 and the cartridge 36 which supplies the phosphors 20 to the nozzle 35. A voltage pattern applied between the substrate 2 and the cartridge 36 is controlled by a voltage control device 56 connected to the power source 55. With this structure, the phosphors 20 in the cartridge 36 can be negatively charged to be electrostatically attracted to the adhesive 21 on the positively charged substrate 2 side via the nozzle 35.

Figure 14:
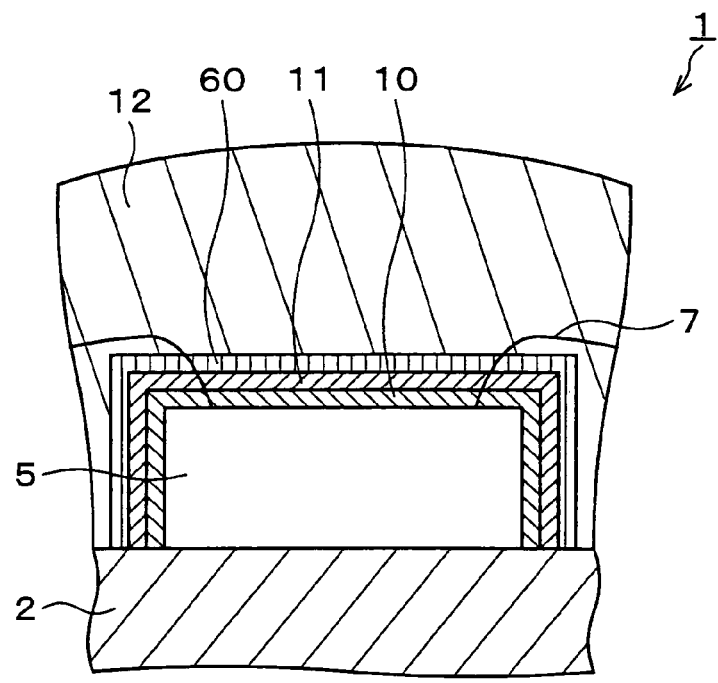
FIG. 14 is a view showing the structure of a light-emitting device 1 according to a second embodiment of the present invention.

As a second embodiment of the present invention, the number of phosphor layers disposed so as to cover light-emitting surfaces of a light-emitting element 5 may be three or more, as shown in FIG. 14. In the case shown in FIG. 14, three kinds of phosphor layers 10, 11, 60 are provided on the light-emitting element 5. The phosphor layer 60 is formed in the same manner as the phosphor layers 10, 11. The phosphor layer 60 contains phosphors 101 emitting, for example, blue light. In the second embodiment, a LED emitting ultraviolet light is used as the light-emitting element 5. The second embodiment of the present invention have the same effects as those of the first embodiment of the present invention shown in FIG. 2.

Figure 15:
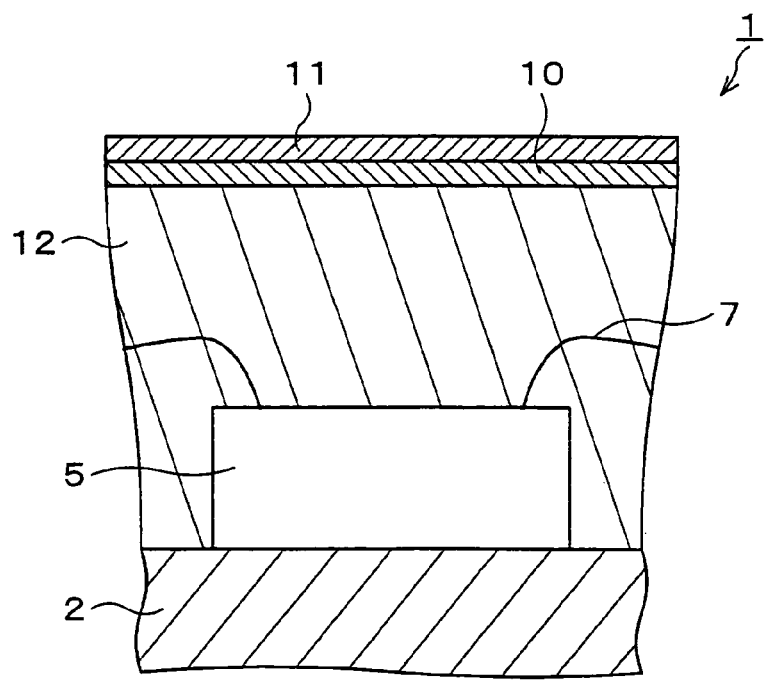
FIG. 15 is a view showing the structure of a light-emitting device 1 according to a third embodiment of the present invention.

As a third embodiment of the present invention, phosphor layers disposed to cover light-emitting surfaces of a light-emitting element 5 may be disposed above the light-emitting surfaces of the light-emitting element 5, not directly but via an intermediate layer formed of a sealing member 12 such as, for example, transparent resin, as shown in FIG. 15. In the case shown in FIG. 15, two kinds of phosphor layers 10, 11 are provided on the sealing member 12 as the intermediate layer. The third embodiment of the present invention has the same effects as those of the first embodiment of the present invention shown in FIG. 2.

Figure 16:
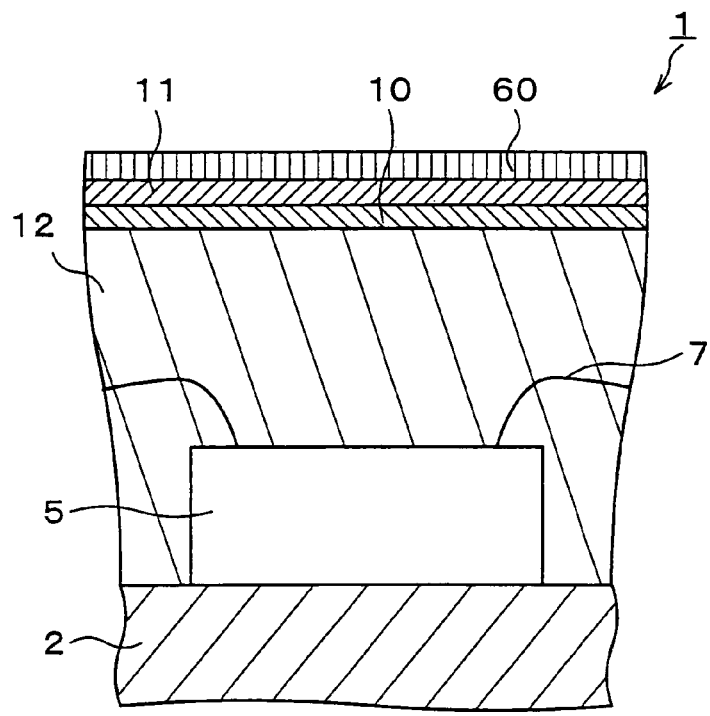
FIG. 16 is a view showing the structure of a light-emitting device 1 according to a fourth embodiment of the present invention.

As a fourth embodiment of the present invention, a light-emitting device 1, though having substantially the same structure as that of the light-emitting device 1 shown in FIG. 15, may have a light-emitting element 5 emitting ultraviolet light and have three phosphor layers 10, 11, 60 formed above the light-emitting element 5 via an intermediate layer 12, as shown in FIG. 16. The phosphor layer 60 of the light-emitting device 1 shown in FIG. 16 is structured in the same manner as the phosphor layers 10, 11, and contains phosphors 101 different from the phosphors 20, 25 contained in the respective phosphor layers 10, 11. The fourth embodiment of the present invention has the same effects as those of the first embodiment of the present invention shown in FIG. 2.

Figure 17:
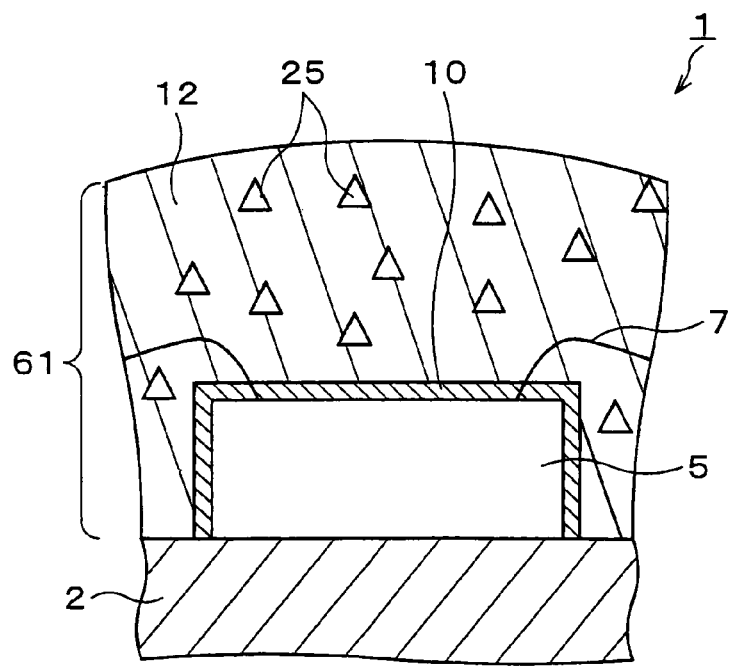
FIG. 17 is a view showing the structure of a light-emitting device 1 according to a fifth embodiment of the present invention.

As a fifth embodiment of the present invention, a phosphor layer 10 disposed directly on light-emitting surfaces of a light-emitting element 5 may be used together with a conventionally known thick phosphor layer dispersed in resin, as shown in FIG. 17. In the case shown in FIG. 17, phosphors 25 are mixed in resin 12 around the phosphor layer 10 to form a conventionally known thick phosphor layer 61. At this time, if the resin 12 contains, as the phosphors 25, fine particles with a 10 μm particle size or less or contains an extremely small amount of the phosphors 25, an influence of the sedimentation of the phosphors 25 is very small, and consequently, the fifth embodiment of the present invention has the same effects as those of the first embodiment of the present invention shown in FIG. 2.

Hitherto, the preferred embodiments of the present invention have been described with reference to the appended drawings, but the present invention is not limited to such examples. It is apparent that those skilled in the art could reach various modified examples or corrected examples within the technical idea described in the claims, and it should be naturally understood that these examples also belong to the technical scope of the present invention.

The above embodiments describe the cases where the LED emitting blue light or ultraviolet light is used as the light-emitting element 5, but the light-emitting element 5 may be an LED emitting other light, or a light-emitting element other than the LED may be used as the light-emitting element 5.

The above embodiments describe the cases where the number of the phosphor forming layers forming the phosphor layer 10 is two or three, but the number of the phosphor forming layers forming the phosphor layer 10 may be any.

The above embodiments describe the cases where the phosphors 20 of one kind are contained in the phosphor layer 10, but the phosphor layer 10 may contain phosphors of two kinds or more.

The above embodiments describe the cases where the intermediate layer formed on the light-emitting surfaces of the light-emitting element 5 is the sealing member 12 such as transparent resin, but the intermediate layer may be formed of a material other than the transparent resin.

The above embodiments describe the cases where the heater 30 is used to heat the applied adhesive 21 to lower its viscosity, but a heating device other than the heater 30 may be used for heating the adhesive 21 to lower the viscosity. Further, the viscosity may be lowered by a solvent diluting the adhesive 21. Further, the dilution of the adhesive 21 by the solvent and the heating may both be adopted.

The above embodiments describe the cases where the sieve (not shown) provided in the nozzle 35 is used to adjust the particle size of the phosphors 20 disposed on the applied adhesive 21, but a method other than the sieve may be used. A method, other than the sieve, for adjusting the particle size of the sprayed phosphors 20 may be, for example, that the phosphors 20, after pulverized, washed, separated, and dried by a ball mill, are put in a shuttle and the inside diameter of a nozzle attached to a tip of the shuttle is adjusted.

EXAMPLES

The present invention will be described by using examples and comparative examples.

Examples 1 to 4 described below are the results of measuring tone unevenness of the light-emitting device 1 according to the embodiment of the present invention, and comparative examples 1, 2 are the results of measuring tone unevenness of conventionally known light-emitting devices 100 respectively. With the use of the tone unevenness measuring device 70 shown in FIG. 9, the tone unevenness was measured based on the results of spectrum analysis of light emitted from each of the light-emitting devices as objects to be measured and detected by the detector 46.

"A half power angle $(2\theta(\frac{1}{2}))$" indicating a directional characteristic of light emitted by the light-emitting device as an object to be measured was calculated as follows based on the analysis results of luminance obtained by the spectroscope 48.

$$2\theta(\frac{1}{2}) = |\theta_1 - \theta_2|$$

If the largest luminance value is defined as 100% and an angle at this time is defined as a reference angle, $\theta_1$ is an angle at which luminance becomes 50% when the light-emitting device is rotated toward the 0° position side from the reference angle and $\theta_2$ is an angle at which luminance becomes 50% when the light-emitting device is rotated toward the 180° position side from the reference angle.

"Color temperature difference (ΔCCT)" indicating the degree of tone unevenness of the light-emitting device as an object to be measured was calculated as a difference between the maximum value and the minimum value of color temperature CCT (Correlated Color Temperature) which was measured within the aforesaid half power angle $(2\theta(\frac{1}{2}))$, based on the spectrum analysis results obtained by the spectroscope 48. Its unit is K (Kelvin).

As for a color rendering property of light emitted by the light-emitting device as an object to be measured, "an average color rendering index (Ra)" indicating the degree of faithful reproduction of standard light specified by JIS was calculated based on the spectrum analysis results obtained by the spectroscope 48.

Example 1

FIG. 18 shows measurement results of a luminance ratio and correlated color temperature of the light-emitting device 1 shown in FIG. 2 in which the two different phosphor layers 10, 11 are stacked directly on the light-emitting element 5 emitting blue light, the measurement being conducted while the position of the light-emitting device 1 was varied in a range from 0° to 180°. In the example 1, the phosphors 20 contained in the phosphor layer 10 emit red light, and the phosphors 25 contained in the phosphor layer 11 emit green light. A particle size of the phosphors 20 was adjusted to 10 μm or less, and a particle size of the phosphors 25 was adjusted to 13 μm or less.

When a cross section of the above sample was observed, occupancy ratios of the phosphors 20 and the phosphors 25 in the phosphor layer 10 and the phosphor layer 11 were both 60% or more, and thicknesses of the phosphor layer 10 and the phosphor layer 11 were equal to or less than five times average particle sizes of the phosphors 20 and the phosphors 25 contained in the respective layers. Further, thickness variation (difference between the maximum thickness and the minimum thickness) of each of the phosphor layer 10 and the phosphor layer 11 was equal to or less than an average particle size of each of the phosphors 20 and the phosphors 25 contained in the respective layers. The average particle sizes of the phosphors 20, 25 contained in the phosphor layers 10, 11 were 7 μm and 10 μm respectively.

Figure 19:
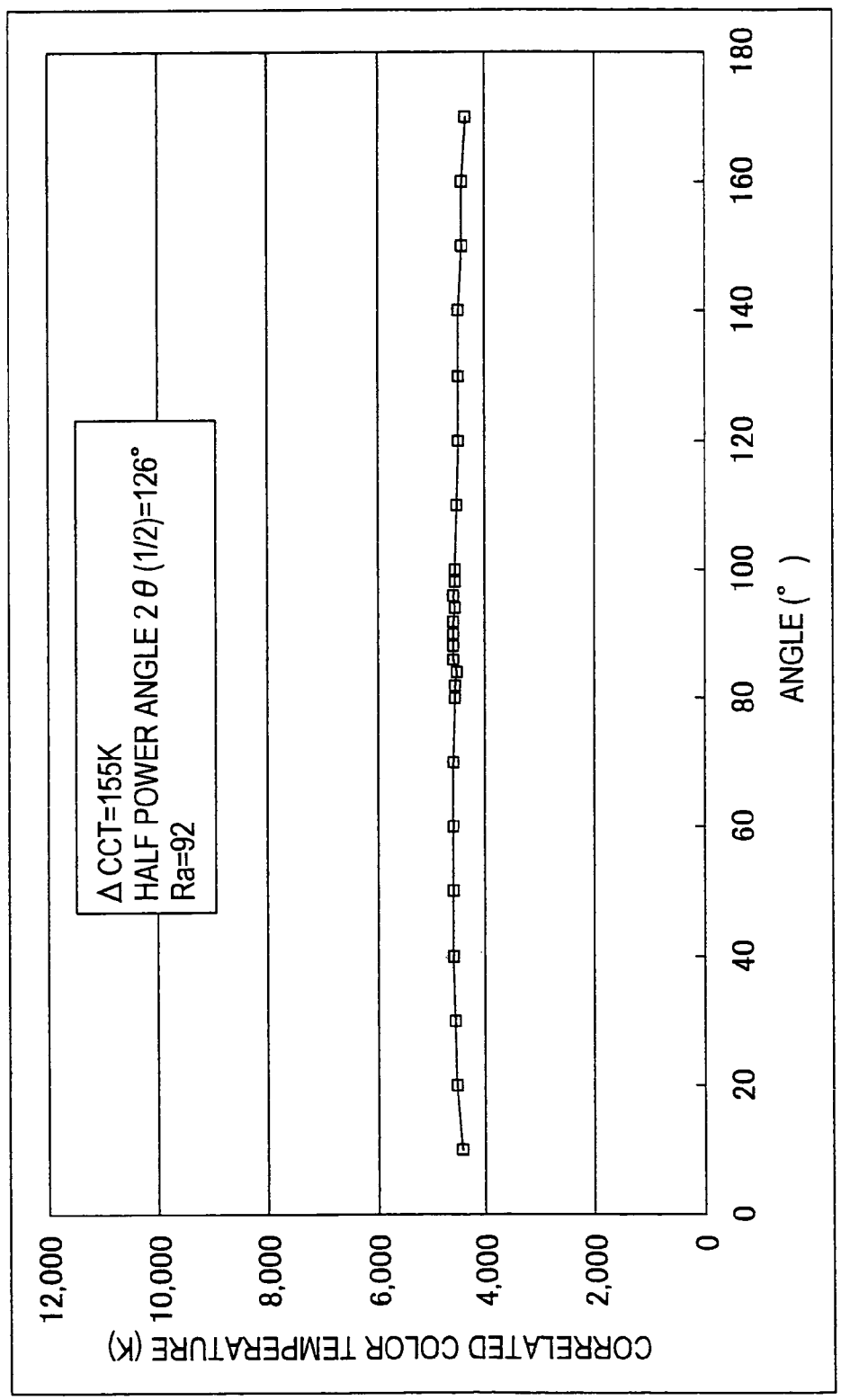
FIG. 19 is a chart showing the measurement results in FIG. 18, which are plotted on coordinates with angle (°) of the light-emitting device 1 taken on the horizontal axis and correlated color temperature (K) taken on the vertical axis.

In FIG. 19, the measurement results in FIG. 18 are shown, being plotted on coordinates with angle (°) of the light-emitting device 1 taken on the horizontal axis and correlated color temperature (K) taken on the vertical axis. As shown in FIG. 18 and FIG. 19, the half power angle $(2\theta(\frac{1}{2}))$ was 126°, and the color temperature difference ΔCCT was 155 K. The average color rendering index Ra when the light-emitting device was at a 90° position was 92.

Example 2

FIG. 20 shows measurement results of a luminance ratio and correlated color temperature of the light-emitting device 1 shown in FIG. 14 in which the three different phosphor layers 10, 11, 60 are stacked directly on the light-emitting element 5 emitting ultraviolet light, the measurement being conducted while the position of the light-emitting device 1 was varied in a range from 0° to 180°. In the example 2, the phosphors 20 contained in the phosphor layer 10 emit red light, the phosphors 25 contained in the phosphor layer 11 emit green light, and the phosphors 101 contained in the phosphor layer 60 emit blue light. A particle size of the phosphors 20 was adjusted to 10 μm or less, a particle size of the phosphors 25 was adjusted to 13 μm or less, and a particle size of the phosphors 101 was adjusted to 20 μm or less.

When a cross section of the above sample was observed, occupancy ratios of the phosphors 20, the phosphors 25, and the phosphors 101 in the phosphor layer 10, the phosphor layer 11, and the phosphor layer 60 were all 60% or more, and thicknesses of the phosphor layer 10, the phosphor layer 11, and the phosphor layer 60 were equal to or less than five times average particle sizes of the phosphors 20, the phosphors 25, and the phosphors 101 contained in the respective layers. Further, thickness variation (difference between the maximum thickness and the minimum thickness) of each of the phosphor layer 10, the phosphor layer 11, and the phosphor layer 60 was equal to or less than the average particle size of each of the phosphors 20, the phosphors 25, and the phosphors 101 contained in the respective layers. The average particle sizes of the phosphors 20, 25, 101 contained in the phosphor layers 10, 11, 60 were 7 μm, 10 μm, and 18 μm respectively.

Figure 21:
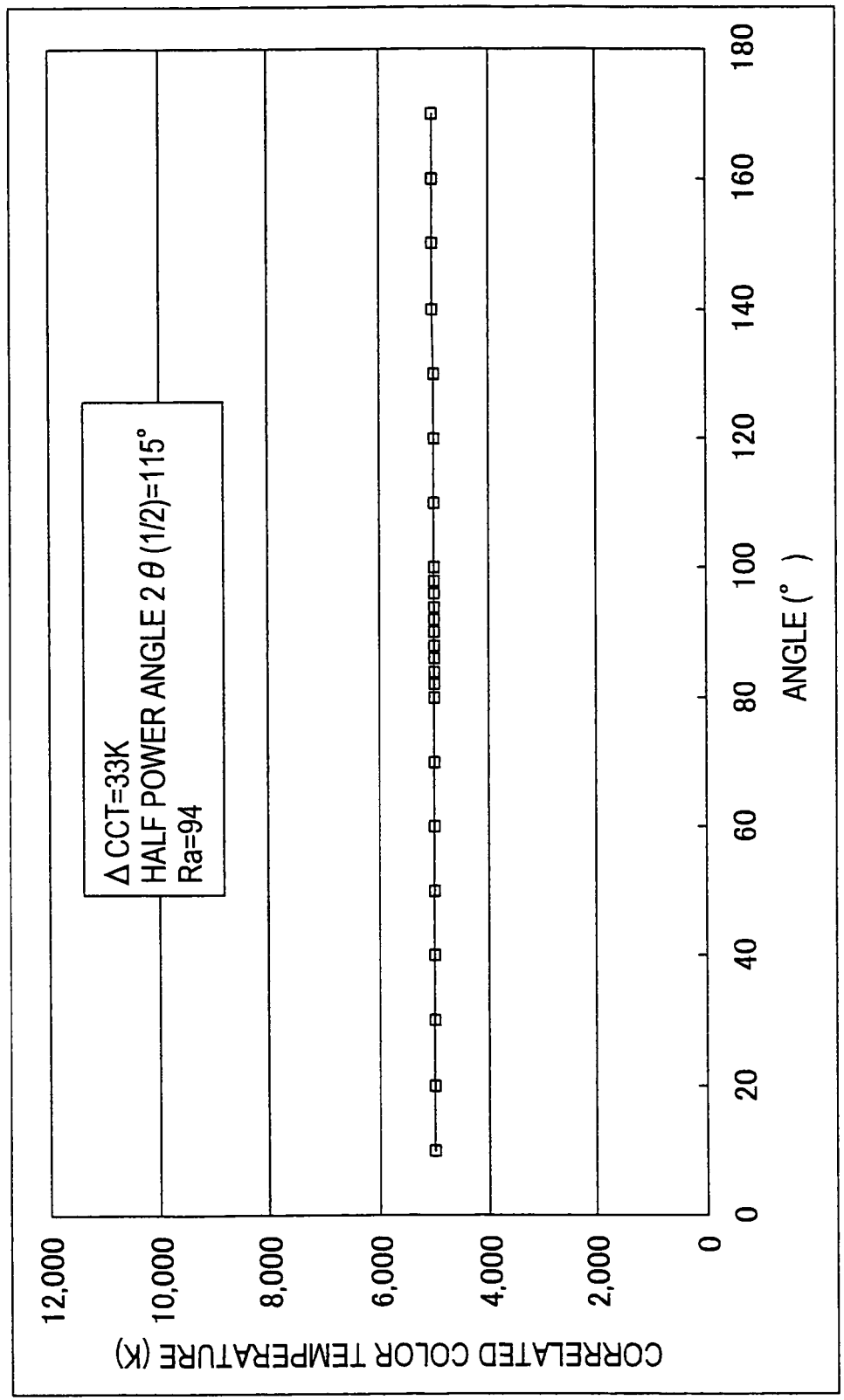
FIG. 21 is a chart showing the measurement results in FIG. 20, which are plotted on coordinates with angle (°) of the light-emitting device 1 taken on the horizontal axis and correlated color temperature (K) taken on the vertical axis.

In FIG. 21, the measurement results in FIG. 20 are shown, being plotted on coordinates with angle (°) of the light-emitting device 1 taken on the horizontal axis and correlated color temperature (K) taken on the vertical axis. As shown in FIG. 20 and FIG. 21, the half power angle (2θ(½)) was 115°, and the color temperature difference ΔCCT was 33 K. The average color rendering index Ra when the light-emitting device was at a 90° position was 94.

Example 3

FIG. 22 shows measurement results of a luminance ratio and correlated color temperature of the light-emitting device 1 shown in FIG. 15 in which the two different phosphor layers 10, 11 are stacked above the light-emitting element 5 emitting blue light, via the intermediate layer 12 provided on the light-emitting element 5, the measurement being conducted while the position of the light-emitting device 1 was varied in a range from 0° to 180°. In the example 3, the phosphors 20 contained in the phosphor layer 10 emit red light, and the phosphors 25 contained in the phosphor layer 11 emit green light. A particle size of the phosphors 20 was adjusted to 10 μm or less, and a particle size of the phosphors 25 was adjusted to 13 μm or less. Average particle sizes of the phosphors 20, 25 contained in the phosphor layers 10, 11 were 7 μm and 10 μm respectively.

When a cross section of the above sample was observed, occupancy ratios of the phosphors 20 and the phosphors 25 in the phosphor layer 10 and the phosphor layer 11 were both 60% or more, and thicknesses of the phosphor layer 10 and the phosphor layer 11 were equal to or less than five times average particle sizes of the phosphors 20 and the phosphors 25 contained in the respective layers. Further, thickness variation (difference between the maximum thickness and the minimum thickness) of each of the phosphor layer 10 and the phosphor layer 11 was equal to or less than the average particle size of each of the phosphors 20 and the phosphors 25 contained in the respective layers.

Figure 23:
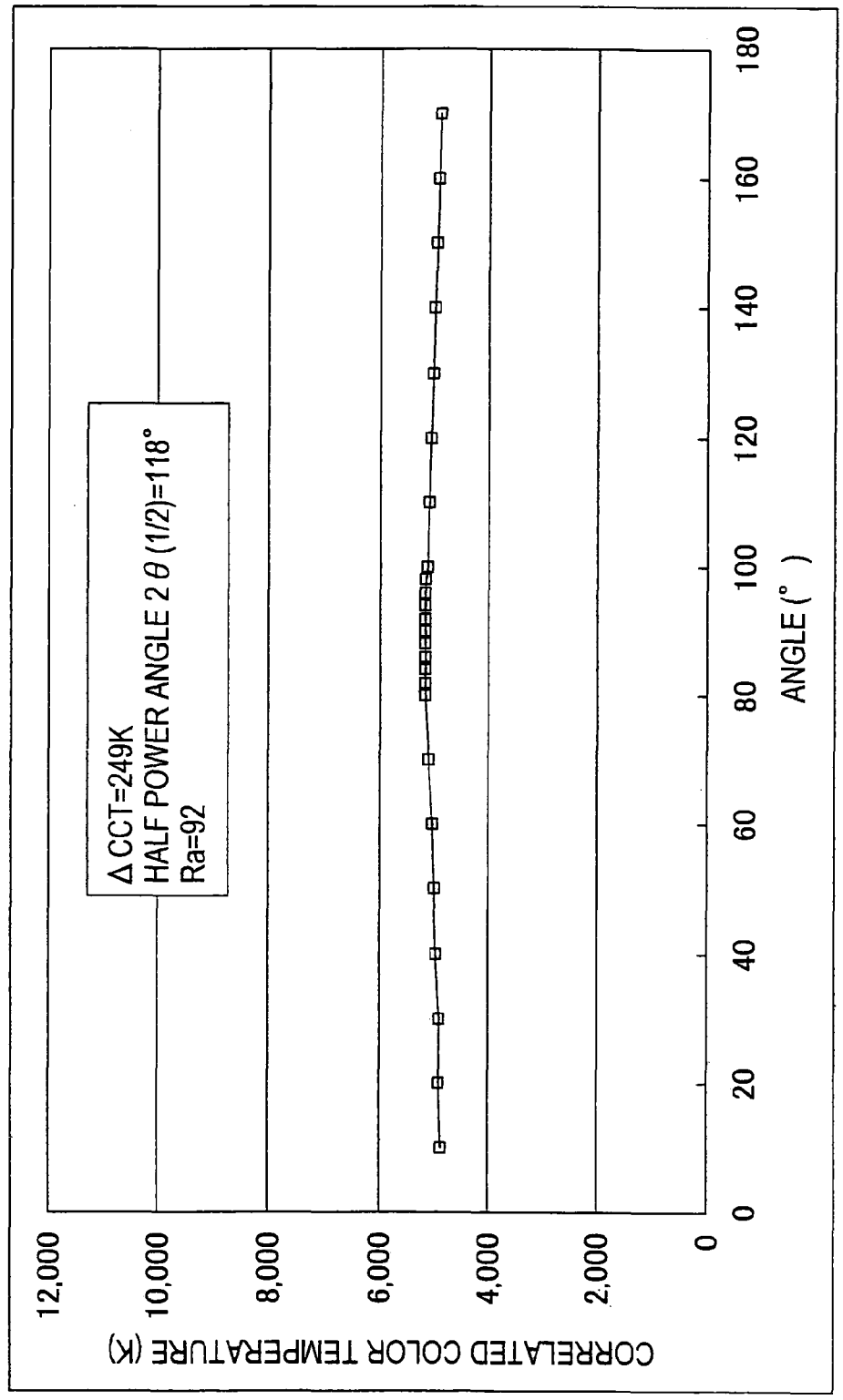
FIG. 23 is a chart showing the measurement results in FIG. 22, which are plotted on coordinates with angle (°) of the light-emitting device 1 taken on the horizontal axis and correlated color temperature (K) taken on the vertical axis.

In FIG. 23, the measurement results in FIG. 22 are shown, being plotted on coordinates with angle (°) of the light-emitting device 1 taken on the horizontal axis and correlated color temperature (K) taken on the vertical axis. As shown in FIG. 22 and FIG. 23, the half power angle (2θ(½)) was 118°, and the color temperature difference ΔCCT was 249 K. The average color rendering index Ra when the light-emitting device was at a 90° position was 92.

Example 4

FIG. 24 shows measurement results of a luminance ratio and correlated color temperature of the light-emitting device 1 shown in FIG. 16 which, though having substantially the same structure as that of the light-emitting device 1 shown in FIG. 15, has the light-emitting element 5 emitting ultraviolet light and has the three phosphor layers 10, 11, 60 formed above the light-emitting element 5 via the intermediate layer 12, the measurement being conducted while the position of the light-emitting device 1 was varied in a range from 0° to 180°. In the example 4, the phosphors 20 contained in the phosphor layer 10 emit red light, the phosphors 25 contained in the phosphor layer 11 emit green light, and the phosphors 101 contained in the phosphor layer 60 emit blue light. A particle size of the phosphors 20 was adjusted to 10 μm or less, a particle size of the phosphors 25 was adjusted to 13 μm or less, and a particle size of the phosphors 101 was adjusted to 20 μm or less.

When a cross section of the above sample was observed, occupancy ratios of the phosphors 20, the phosphors 25, and the phosphors 101 in the phosphor layer 10, the phosphor layer 11, and the phosphor layer 60 were all 60% or more, and thicknesses of the phosphor layer 10, the phosphor layer 11, and the phosphor layer 60 were equal to or less than five times average particle sizes of the phosphors 20, the phosphors 25, and the phosphors 101 contained in the respective layers. Further, thickness variation (difference between the maximum thickness and the minimum thickness) of each of the phosphor layer 10, the phosphor layer 11, and phosphor layer 60 was equal to or less than two times the average particle size of each of the phosphors 20, the phosphors 25, and the phosphors 101 contained in the respective layers. The average particle sizes of the phosphors 20, 25, 101 contained in the phosphor layers 10, 11, 60 were 7 μm, 10 μm, and 18 μm respectively.

Figure 25:
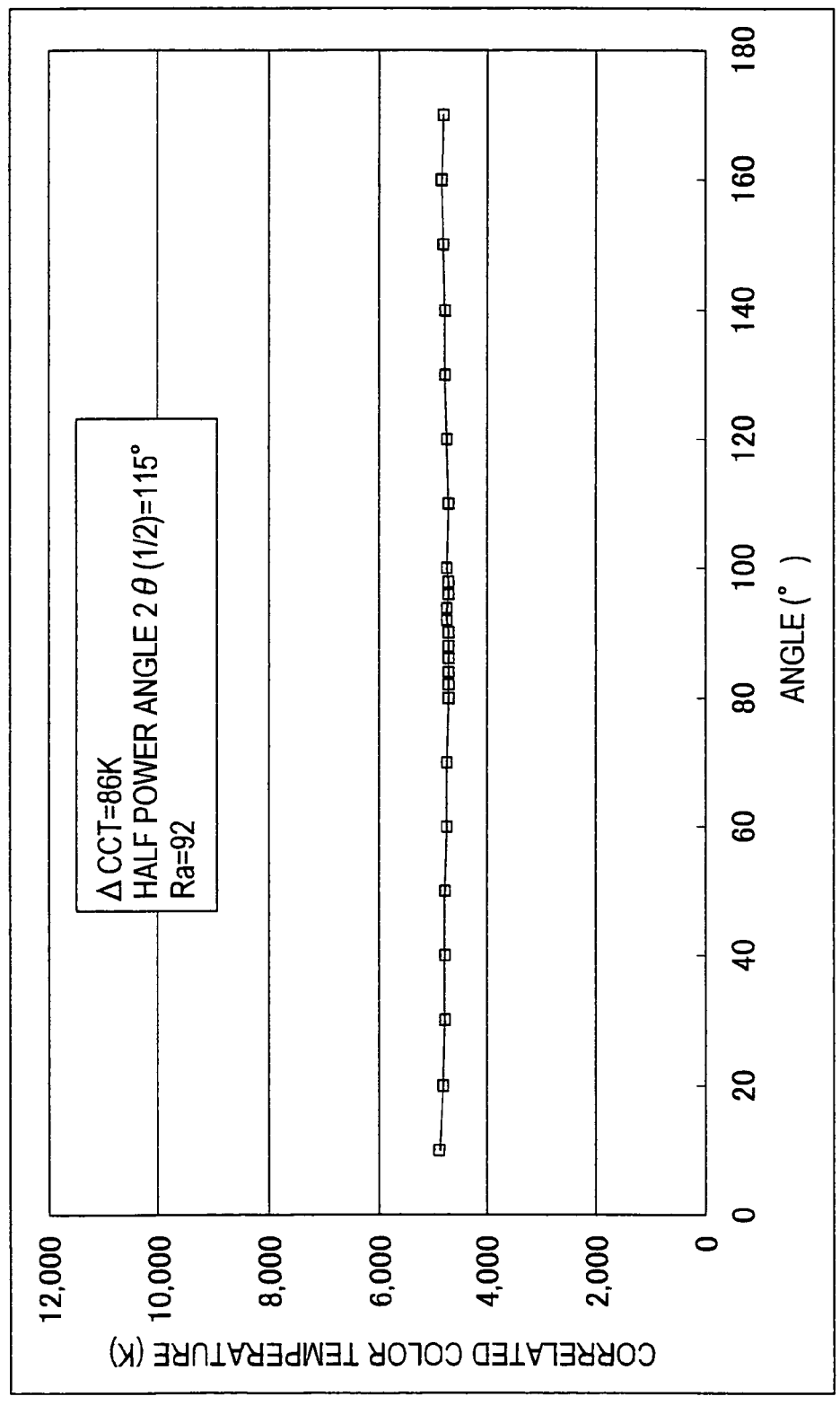
FIG. 25 is a chart showing the measurement results in FIG. 24, which are plotted on coordinates with angle (°) of the light-emitting device 1 taken on the horizontal axis and correlated color temperature (K) taken on the vertical axis.

In FIG. 25, the measurement results in FIG. 24 are shown, being plotted on coordinates with angle (°) of the light-emitting device 1 taken on the horizontal axis and correlated color temperature (K) taken on the vertical axis. As shown in FIG. 24 and FIG. 25, the half power angle (2θ(½)) was 115°, and the color temperature difference ΔCCT was 86 K. The average color rendering index Ra when the light-emitting device was at a 90° position was 92.

Comparative Example 1

Figure 27:
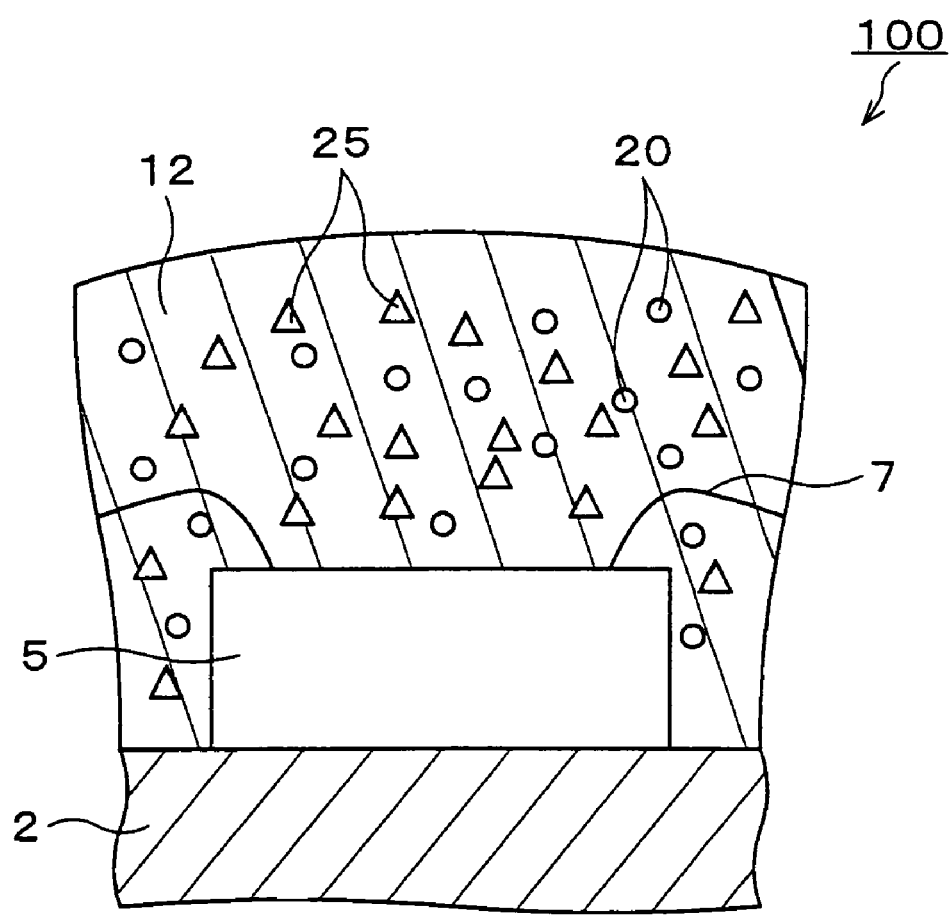
FIG. 27 is a view showing the structure of the conventionally known light-emitting device 100 as the comparative example 1.
Figure 28:
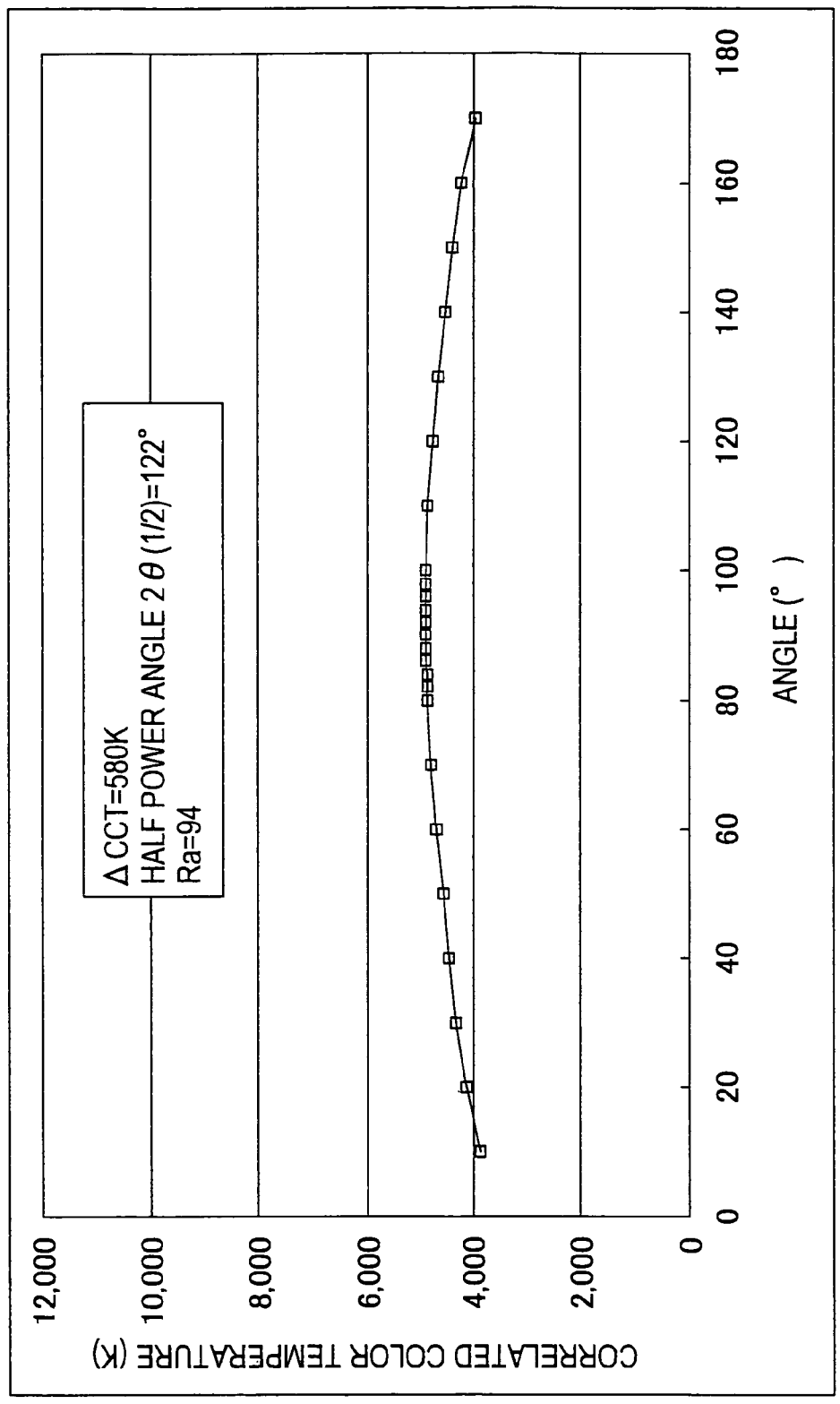
FIG. 28 is a chart showing the measurement results in FIG. 26, which area plotted on coordinates with angle (°) of the light-emitting device 100 taken on the horizontal axis and correlated color temperature (K) taken on the vertical axis.

FIG. 26 shows measurement results of a luminance ratio and correlated color temperature of a conventionally known light-emitting device 100 shown in FIG. 27, the measurement being conducted while the position of the light-emitting device 100 was varied in a range from 0° to 180°. In FIG. 28, the measurement results in FIG. 26 are shown, being plotted on coordinates with angle (°) of the light-emitting device 100 taken on the horizontal axis and correlated color temperature (K) taken on the vertical axis. The conventionally known light-emitting device 100 shown in FIG. 27 is structured such that resin in which the phosphors 20 emitting red light and the phosphors 25 emitting green light are mixed is thickly disposed around the light-emitting element 5 disposed on the substrate 2. As the light-emitting element 5, the light-emitting element 5 emitting blue light was used.

The total occupancy ratio of the phosphors 20 and the phosphors 25 in the resin was less than 50%, specifically 5%, and thickness variation (difference between the maximum thickness and the minimum thickness) of the phosphor layer exceeded two times an average particle size of the phosphors 20, 25.

As shown in FIG. 26 and FIG. 28, the half power angle ($2\theta(\frac{1}{2})$) was 122°, and the color temperature difference $\Delta$CCT was 580 K. The average color rendering index Ra when the light-emitting device was at a 90° position was 94.

Comparative Example 2

Figure 30:
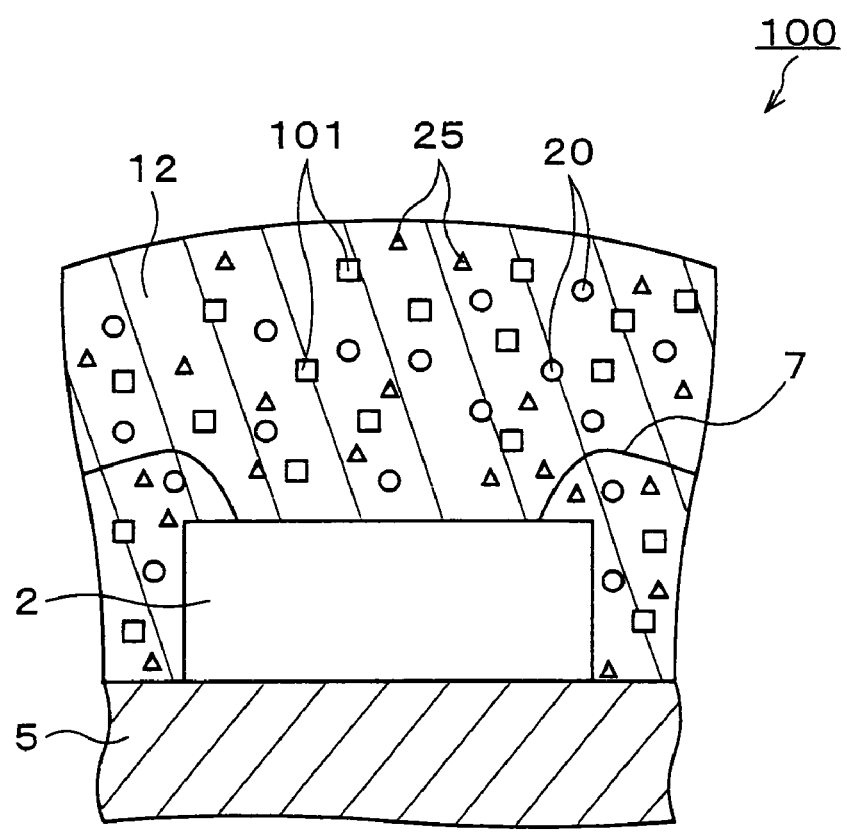
FIG. 30 is a view showing the structure of the conventionally known light-emitting device 100 as the comparative example 2.
Figure 31:
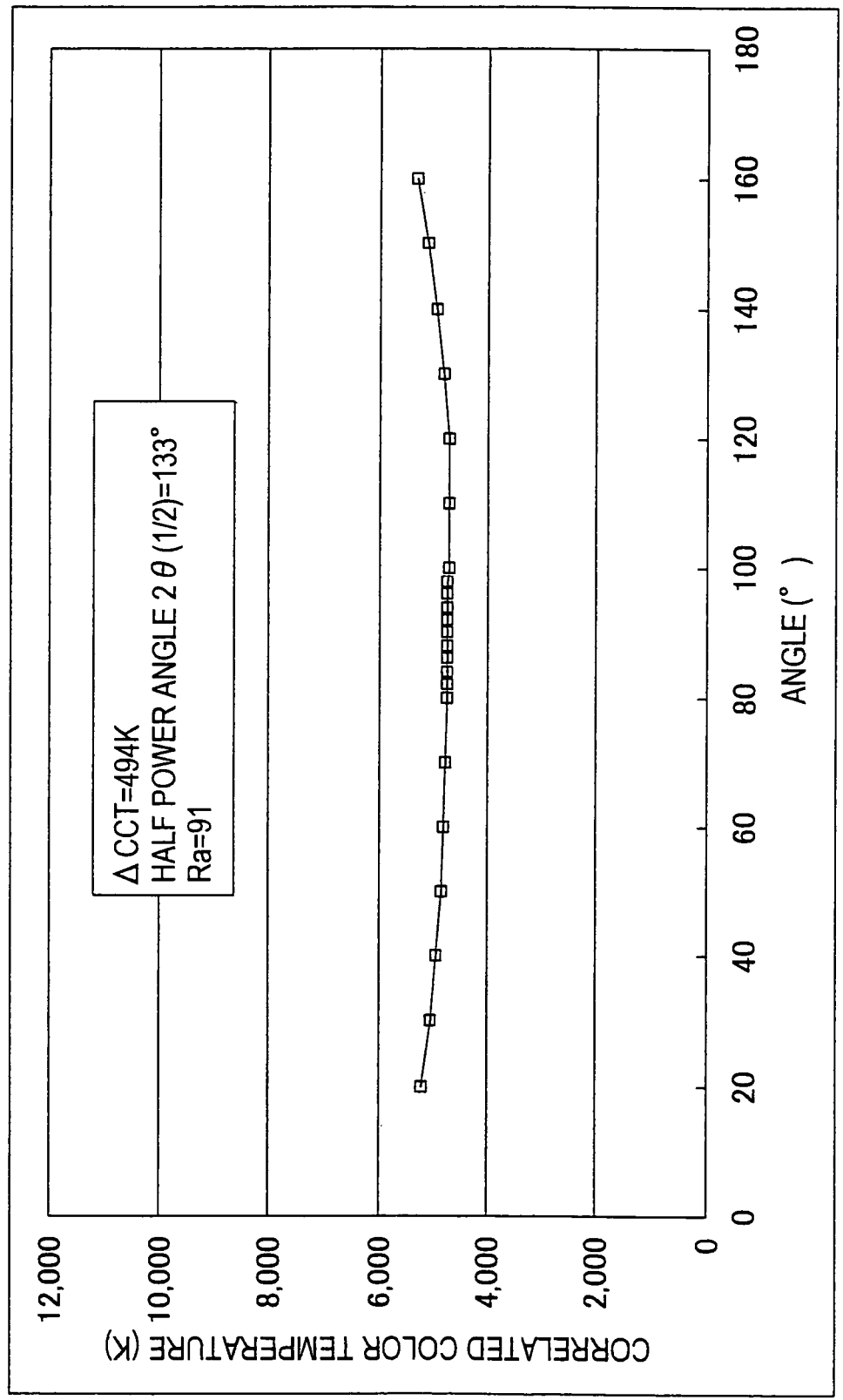
FIG. 31 is a chart showing the measurement results in FIG. 29, which are plotted on coordinates with angle (°) of the light-emitting device 100 taken on the horizontal axis and correlated color temperature (K) taken on the vertical axis.

FIG. 29 shows measurement results of a luminance ratio and correlated color temperature of another conventionally known light-emitting device 100 shown in FIG. 30, the measurement being conducted while the position of the light-emitting device 100 was varied in a range from 0° to 180°. In FIG. 31, the measurement results in FIG. 29 are shown, being plotted on coordinates with angle (°) of the light-emitting device 100 taken on the horizontal axis and correlated color temperature (K) taken on the vertical axis. The other conventionally known light-emitting device 100 shown in FIG. 30 is structured such that resin in which the phosphors 20 emitting red light, the phosphors 25 emitting green light, and the phosphors 101 emitting blue light are mixed is thickly disposed around the light-emitting element 5 disposed on the substrate 2. As the light-emitting element 5, the light-emitting element 5 emitting ultraviolet light was used.

The total occupancy ratio of the phosphors 20, 25, 101 in the resin was less than 50%, specifically 5%, and thickness variation (difference between the maximum thickness and the minimum thickness) of the phosphor layer exceeded two times an average particle size of the phosphors 20, 25, 101.

As shown in FIG. 29 and FIG. 31, the half power angle ($2\theta(\frac{1}{2})$) was 133°, and the color temperature difference $\Delta$CCT was 494 K. The average color rendering index Ra when the light-emitting device was at a 90° position was 91.

As described above, in the examples 1 to 4 for the light-emitting device 1 of the present invention, the values of the color temperature difference $\Delta$CCT indicating the degree of tone unevenness are 33 K to 249 K and it is seen that, compared with the values 580 K and 494 K of $\Delta$CCT in the comparative examples 1, 2 for the conventionally known light-emitting device 100, tone unevenness of light emitted by the light-emitting device of the present invention is greatly reduced. Further, the values of the average color rending property Ra in the examples 1 to 4 for the light-emitting device 1 of the present invention are 92 to 94, and thus it is seen that white light emitted by the light-emitting device 1 of the present invention has a high color rendering property and can be the reproduction of light closer to the standard light.

What is claimed is:

1. A light-emitting device comprising:
   a light-emitting element; and
   a phosphor layer stacked directly on a light-emitting surface of said light-emitting element containing a kind of phosphors that absorb light from the light-emitting element and wavelength-convert the absorbed light to emit a particular color,
   wherein a difference between a maximum thickness and a minimum thickness of said phosphor layer in a light-emitting direction is equal to or less than two times an average particle size of the phosphors,
   wherein the phosphor layer is composed of a plurality of stacked phosphor forming layers, and
   wherein an occupancy ratio of the phosphors in the phosphor forming layer farthest from the light-emitting element is 50% or less, and an occupancy ratio of the phosphors in the other phosphor forming layers is 60% or more.

2. The light-emitting device according to claim 1, wherein said light-emitting device comprises the other phosphor layers containing a different kind of phosphors from said phosphor layer.

3. The light-emitting device according to claim 1,
   wherein a thickness of said phosphor layer is equal to or less than five times the average particle size of the phosphors.

4. The light-emitting device according to claim 1,
   wherein said phosphor forming layers are each composed of: an adhesive whose thickness is equal to or less, than the average particle size of the phosphors; and the phosphors.

5. The light-emitting device according to claim 1,
   wherein in each of said phosphor layers, the particle size of the phosphors is set to a predetermined value or smaller within a range of 20 μm or smaller.

6. A manufacturing method of a light-emitting device comprising: a light-emitting element; and a phosphor layer stacked directly on a light-emitting surface of said light-emitting element containing a kind of phosphors that absorb light from the light-emitting element and wavelength-convert the absorbed light to emit a particular color, the method comprising the steps of:
   forming the phosphor layer directly or via an intermediate layer on a light-emitting surface of the light-emitting element so as to cover the light-emitting surface of the light-emitting element, a difference between a maximum thickness and a minimum thickness of the phosphor layer in a light-emitting direction being equal to or less than two times an average particle size of the phosphors,
   wherein said phosphor layer is composed of a plurality of phosphor forming layers, and
   wherein color temperature of the phosphors in the phosphor layer is adjusted by setting an occupancy ratio of the phosphors in the phosphor forming layer formed last to 50% or less and setting an occupancy ratio of the phosphors in the other phosphor forming layers to 60% or more.

7. The manufacturing method of the light-emitting device according to claim 6,
   wherein the phosphor layer is formed to have a thickness equal to or less than five times the average particle size of the phosphors.

8. The manufacturing method of the light-emitting device according to claim 6,
   wherein, in forming the phosphor layer, a step of forming the phosphor forming layer is performed until desired color temperature is obtained from the phosphor layer, the step of forming the phosphor forming layer being a step in which an adhesive with a thickness less than the average particle size of the phosphors is applied on a surface for stacking, and the phosphors are disposed on the applied adhesive to form the phosphor forming layer.

9. The manufacturing method of the light-emitting device according to claim 6, wherein the adhesive is applied while the surface for stacking is being heated by a heater.

10. The manufacturing method of the light-emitting device according to claim 6,
wherein, in disposing the phosphors, a particle size of the phosphors is set to a predetermined value or smaller within a range of 20 microns or smaller in each of the phosphor layers.

11. The manufacturing method of the light-emitting device according to claim 6,
wherein, when the plural phosphor forming layers are stacked, the desired color temperature is obtained by repetition of the application of the adhesive, bonding of the phosphors, temporary curing of the adhesive, measurement of the color temperature, and verification of a result of the measurement.

12. A manufacturing method of a light-emitting device comprising: a light-emitting element; and a phosphor layer stacked directly on a light-emitting surface of said light-emitting element containing a kind of phosphors that absorb light from the light-emitting element and wavelength-convert the absorbed light to emit a particular color, the method comprising the steps of:

forming the phosphor layer directly or via an intermediate layer on a light-emitting surface of the light-emitting element so as to cover the light-emitting surface of the light-emitting element, a difference between a maximum thickness and a minimum thickness of the phosphor layer in a light-emitting direction being equal to or less than two times an average particle size of the phosphors, wherein said phosphor layer is composed of a plurality of phosphor forming layers, wherein color temperature of the phosphors in the phosphor layer is adjusted by setting an occupancy ratio of the phosphors in the phosphor forming layer formed last to 50% or less and setting an occupancy ratio of the phosphors in the other phosphor forming layers to 60% or more, and wherein said light-emitting device comprises the other phosphor layers containing a different kind of phosphors from said phosphor layer.

* * * * *